(12) United States Patent
Ooi et al.

(10) Patent No.: US 8,648,260 B2
(45) Date of Patent: Feb. 11, 2014

(54) WIRING SUBSTRATE

(75) Inventors: Takahiro Ooi, Kawasaki (JP); Yoshihiro Morita, Kawasaki (JP); Akiko Matsui, Kawasaki (JP); Tetsuro Yamada, Kawasaki (JP); Mitsuhiko Sugane, Kawasaki (JP); Takahide Mukoyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 317 days.

(21) Appl. No.: 13/075,838

(22) Filed: Mar. 30, 2011

(65) Prior Publication Data
US 2011/0308840 A1  Dec. 22, 2011

(30) Foreign Application Priority Data
Jun. 17, 2010 (JP) .................. 2010-138127

(51) Int. Cl.
*H05K 1/09* (2006.01)
*H05K 7/00* (2006.01)
*H05K 1/03* (2006.01)

(52) U.S. Cl.
USPC ................ 174/251; 361/777; 174/255

(58) Field of Classification Search
USPC ............. 174/251, 255, 258, 262, 250, 257; 361/777; 333/247
See application file for complete search history.

(56) References Cited

U.S. PATENT DOCUMENTS

| | | | |
|---|---|---|---|
| 2004/0130877 A1* | 7/2004 | Okubora | 361/793 |
| 2004/0181764 A1* | 9/2004 | Brist et al. | 716/6 |
| 2005/0146403 A1 | 7/2005 | Okubora et al. | |
| 2007/0145595 A1 | 6/2007 | Hall et al. | |
| 2007/0222052 A1* | 9/2007 | Kabumoto | 257/679 |
| 2008/0176471 A1 | 7/2008 | Ogihara et al. | |
| 2009/0107710 A1* | 4/2009 | Goergen | 174/258 |
| 2009/0169842 A1 | 7/2009 | Morita | |
| 2010/0051327 A1* | 3/2010 | Ogatsu | 174/254 |

FOREIGN PATENT DOCUMENTS

JP  2009-073946  4/2009

OTHER PUBLICATIONS

European Search Report application No. 11160730.5 dated Jul. 18, 2011.

* cited by examiner

*Primary Examiner* — Chau Nguyen
*Assistant Examiner* — Roshn Varghese
(74) *Attorney, Agent, or Firm* — Squire Sanders (US) LLP

(57) ABSTRACT

A wiring substrate includes differential wirings; a first insulating layer adjacent to one side of the differential wirings, including first fiber bundles parallel to the differential wirings; a second insulating layer adjacent to another side of the differential wirings, including second fiber bundles parallel to the differential wirings and disposed by the same pitch as the first fiber bundles; a third insulating layer on the first insulating layer on a side opposite to the differential wirings, including third fiber bundles in parallel to the differential wirings; and a fourth insulating layer on the second insulating layer on a side opposite to the differential wirings, including fourth fiber bundles in parallel to the differential wirings. Intervals of the third and fourth fiber bundles are respectively narrower than intervals of the first and second fiber bundles. The differential wirings are disposed between adjacent first fiber bundles, and between adjacent second fiber bundles.

4 Claims, 19 Drawing Sheets

WIRING SUBSTRATE

CROSS-REFERENCE TO RELATED APPLICATION

This patent application is based upon and claims the benefit of priority of the prior Japanese Patent Application No. 2010-138127 filed on Jun. 17, 2010, the entire contents of which are incorporated herein by reference.

FIELD

The embodiments discussed herein are related to a wiring substrate in which differential wirings are formed on an insulating layer.

BACKGROUND

An object of a conventional technology is to avoid accumulation of phase shift on one of a P wiring and an N wiring, by arranging yarn of a glass cloth parallel to an extending direction of wirings so that the yarn intersects the differential wirings in a zig-zag manner, and to therefore prevent generation of skew between the wirings.

Warp yarn 4 and weft yarn 5 constituting glass cloth used for forming a substrate for lamination are arranged so that one or both of the warp yarn 4 and the weft yarn 5 are arranged in a zig-zag manner by a length equal to the total of the widths of differential wirings and the distances between the wirings. Accordingly, the variation in the relative dielectric constant of the substrate for lamination is averaged, thus mitigating the deterioration of waveform quality in differential transmission.

Patent document 1: Japanese Laid-Open Patent Publication No. 2009-73946

SUMMARY

According to an aspect of the invention, a wiring substrate includes a pair of differential wirings; a first insulating layer that is provided adjacent to one side of the pair of differential wirings, the first insulating layer including first fiber bundles disposed in parallel to an extending direction of the pair of differential wirings; a second insulating layer that is provided adjacent to another side of the pair of differential wirings, the second insulating layer including second fiber bundles disposed in parallel to the extending direction of the pair of differential wirings, the second fiber bundles being disposed by the same pitch as the first fiber bundles; a third insulating layer that is provided on a side of the first insulating layer opposite to a side of the first insulating layer that is adjacent to the pair of differential wirings, the third insulating layer including third fiber bundles disposed in parallel to the extending direction of the pair of differential wirings; and a fourth insulating layer that is provided on a side of the second insulating layer opposite to a side of the second insulating layer that is adjacent to the pair of differential wirings, the fourth insulating layer including fourth fiber bundles disposed in parallel to the extending direction of the pair of differential wirings, wherein intervals between the third fiber bundles and intervals between the fourth fiber bundles are respectively narrower than intervals between the first fiber bundles and intervals between the second fiber bundles, and the pair of differential wirings are disposed between adjacent ones of the first fiber bundles at positions that do not overlap the first fiber bundles in a planar view, and are disposed between adjacent ones of the second fiber bundles at positions that do not overlap the second fiber bundles in a planar view.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1:
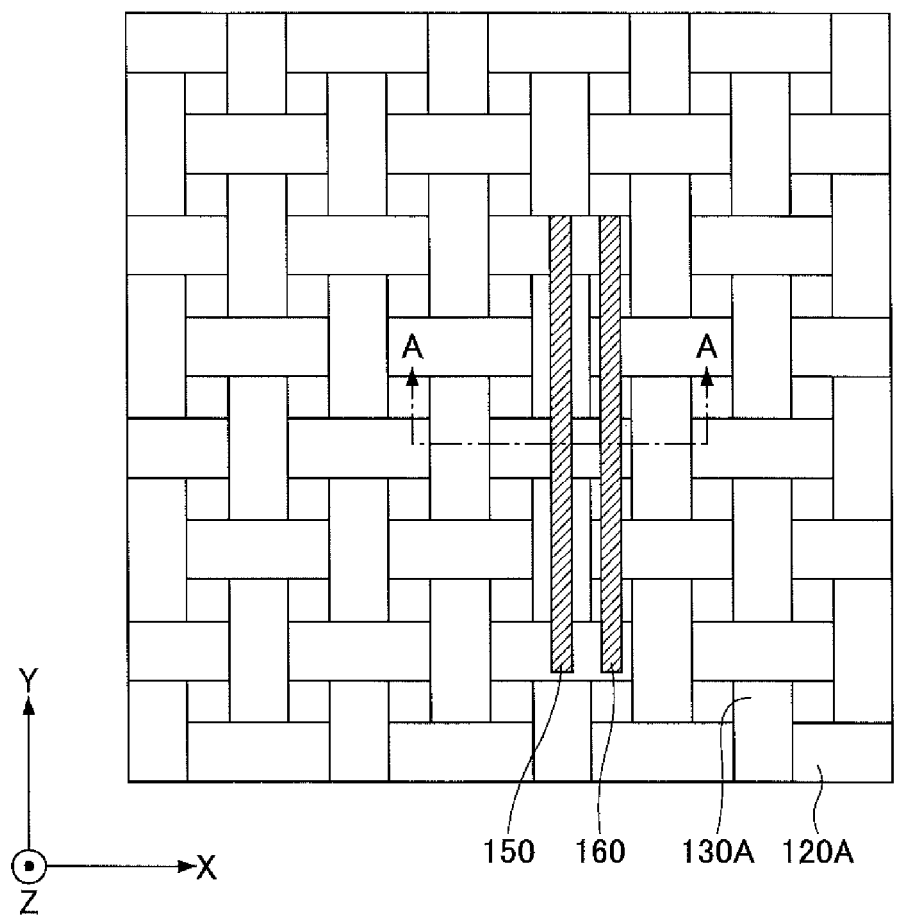
FIG. 1 is a transparent plan view of main parts of a conventional wiring substrate.

Preferred embodiments of the present invention will be explained with reference to accompanying drawings. Throughout the drawings, common components are denoted by the same reference numerals, and redundant descriptions may be omitted.

Figure 2:
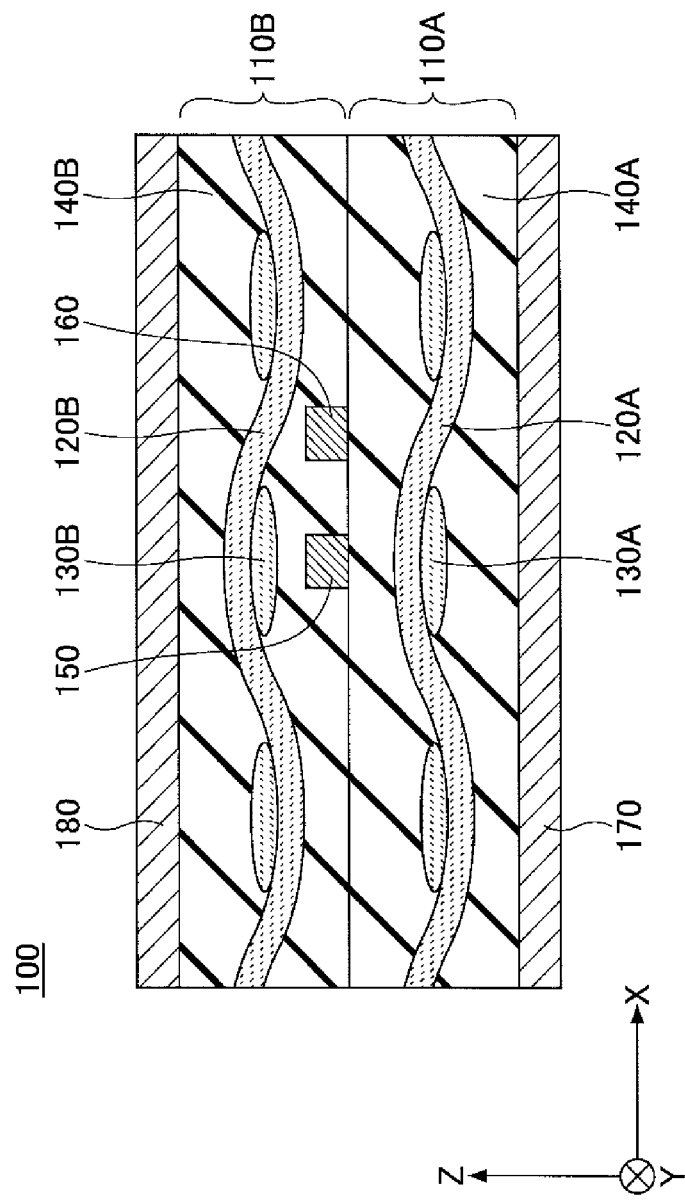
FIG. 2 is a cross-sectional view of main parts of the conventional wiring substrate.

FIG. 1 is a transparent plan view of main parts of an example of a wiring substrate. FIG. 2 is a cross-sectional view of main parts of the example of the wiring substrate. Some of the elements illustrated in FIG. 2 are not illustrated in FIG. 1. FIG. 2 is a cross-sectional view cut along a line A-A in FIG. 1.

As illustrated in FIG. 1 and FIG. 2, in an example of a wiring substrate 100, a reference 170, an insulating layer 110A, wirings 150 and 160, an insulating layer 110B, and a reference 180 are laminated.

The insulating layer 110A includes glass fiber bundles 120A and 130A, and insulating resin 140A. The glass fiber bundles 120A and 130A are impregnated with the insulating resin 140A. The insulating layer 110B includes glass fiber bundles 120B and 130B, and insulating resin 140B. The glass fiber bundles 120B and 130B are impregnated with the insulating resin 140B.

The glass fiber bundles 120A are disposed in a direction parallel to an X axis, and the glass fiber bundles 130A are disposed in a direction parallel to a Y axis. The glass fiber bundles 120A and 130A are plain-woven in a lattice-like manner. Similarly, the glass fiber bundles 120B are disposed in a direction parallel to an X axis, and the glass fiber bundles 130B are disposed in a direction parallel to a Y axis. The glass fiber bundles 120B and 130B are plain-woven in a lattice-like manner. The glass fiber bundles 120B and 130B are disposed at positions corresponding to the glass fiber bundles 120A and 130A.

The wirings 150 and 160 are selectively formed on one side of the insulating layer 110A. The reference 170 is formed on substantially the entire surface of the other side of the insulating layer 110A. The reference 180 is formed on substantially the entire surface of the insulating layer 110B, on the side opposite to that adjacent to the wirings 150 and 160. The wirings 150 and 160 are conducting bodies through which predetermined electric signals flow. The references 170 and 180 are conducting bodies acting as return circuits of the predetermined electric signals flowing through the wirings 150 and 160.

The wirings 150 and 160 are disposed in parallel, and are differential wirings used for the differential transmission method. Typically, high-speed transmission is performed with high performance by the differential transmission method. However, the wiring 150 is disposed on one of the glass fiber bundles 130A, while the wiring 160 is disposed between the glass fiber bundle 130A on which the wiring 150 is disposed and an adjacent glass fiber bundle 130A (between adjacent glass fiber bundles 130A).

In recent years, wirings have become thinner than the pitches between glass fiber bundles. Therefore, in many cases, a wiring substrate includes wirings positioned on glass fiber bundles as well as wirings positioned between glass fiber bundles. The relative permittivity on a glass fiber bundle is different from the relative permittivity between glass fiber bundles (on the insulating resin), due to the difference in the glass fiber density. Therefore, when there are wirings positioned on glass fiber bundles as well as wirings positioned between glass fiber bundles, there may be inconsistencies in characteristic impedance and differences in the propagation delay time. Particularly, in recent years, the frequency of high-speed transmission has approached a range of 3 GHz through 5 GHz, and therefore problems are arising in connection with inconsistencies in characteristic impedance and differences in the propagation delay time.

In order to solve such problems, there is a technology of arranging the wirings in a zig-zag manner by changing the angle of the wirings at a certain length with respect to the glass fiber bundles that are plain-woven in a lattice-like manner. There is also a technology of propagating high frequency signals by using a low-dielectric material as the material of the wiring substrate. Furthermore, in order to achieve the same effects as the technology of arranging the wirings in a zig-zag manner, there is a technology of tilting the wiring substrate and laminating layers.

However, the technology of arranging wirings in a zig-zag manner uses excessive wirings, and therefore the manufacturing cost is increased. Furthermore, with the technology of propagating high frequency signals by using a low-dielectric material as the material of the wiring substrate, the low-dielectric material is expensive, and therefore the manufacturing cost is increased. Furthermore, with the technology of tilting the wiring substrate and laminating layers, the material efficiency significantly decreases as the tilt angle increases, and therefore the manufacturing cost is increased.

First Embodiment

Figure 3:
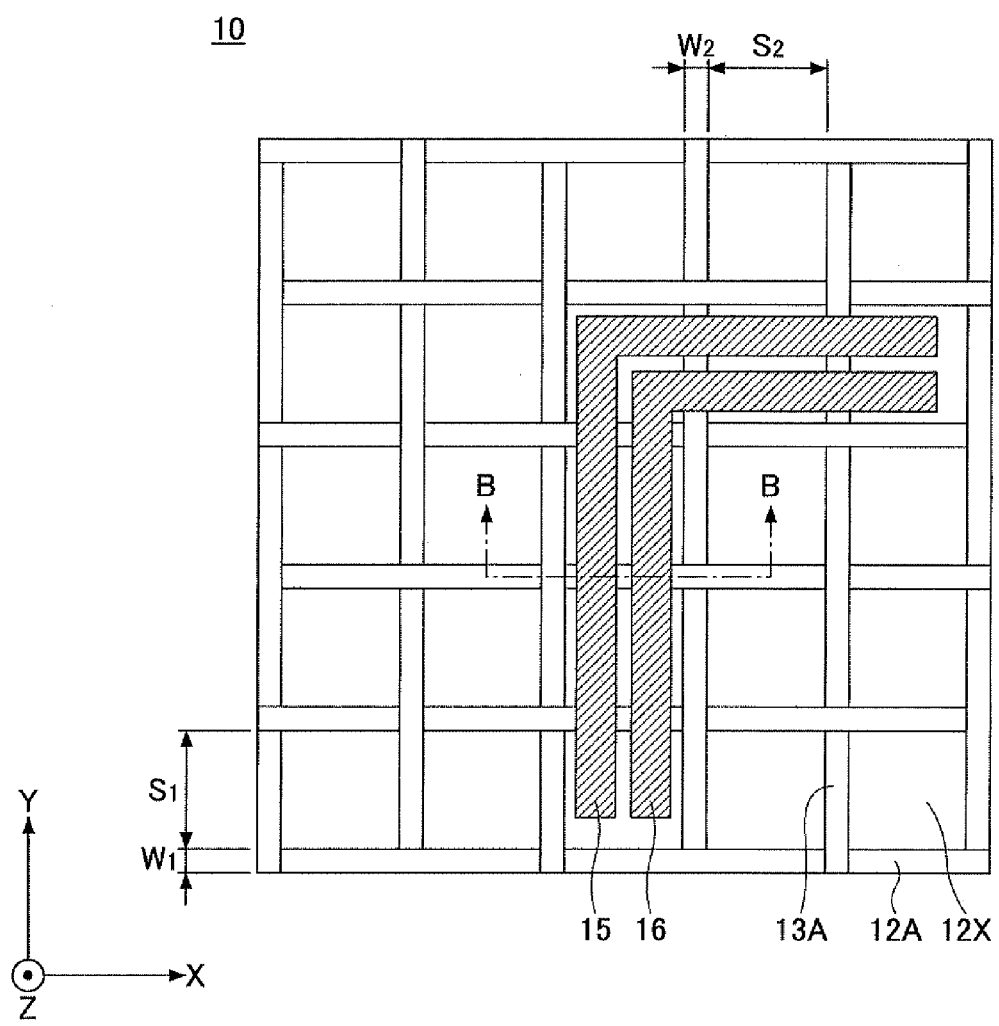
FIG. 3 is a transparent plan view of main parts of a wiring substrate according to a first embodiment.
Figure 4:
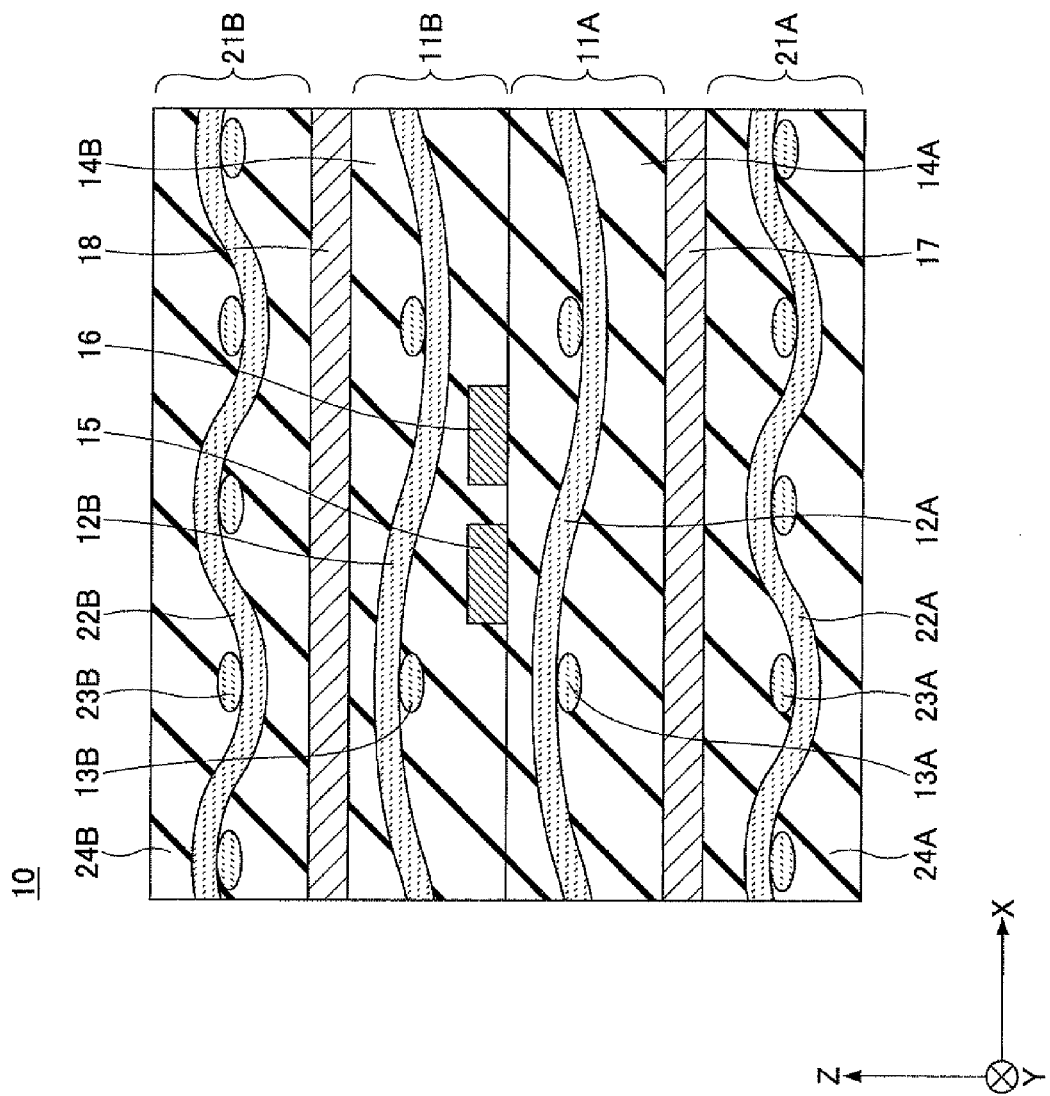
FIG. 4 is a cross-sectional view of main parts of the wiring substrate according to the first embodiment.

FIG. 3 is a transparent plan view of main parts of a wiring substrate according to a first embodiment. FIG. 4 is a cross-sectional view of main parts of the wiring substrate according to the first embodiment. Some of the elements illustrated in FIG. 4 are not illustrated in FIG. 3. FIG. 4 is a cross-sectional view cut along a line B-B in FIG. 3. As illustrated in FIGS. 3 and 4, in a wiring substrate 10, an insulating layer 21A, a reference 17, an insulating layer 11A, wirings 15 and 16, an insulating layer 11B, a reference 18, and an insulating layer 21B are laminated. A detailed description is given of the respective components of the wiring substrate 10.

The insulating layer 11A includes glass fiber bundles 12A and 13A, and insulating resin 14A. The glass fiber bundles 12A and 13A are impregnated with the insulating resin 14A. The insulating resin 14A may be made of a material such as epoxy resin, polymide resin, and polyester resin. The insulating resin 14A may include filler such as silica and alumina.

The glass fiber bundles 12A having a width of $W_1$ are disposed in a direction parallel to an X axis with intervals of $S_1$. The glass fiber bundles 13A having a width of $W_2$ are disposed in a direction parallel to a Y axis with intervals of $S_2$. The glass fiber bundles 12A and 13A are plain-woven in a lattice-like manner. A member in which glass fiber bundles are plain-woven in a lattice-like manner may be referred to as a glass cloth. Each of the glass fiber bundles 12A and 13A is formed by bundling together plural glass fibers of, for example, several millimeters to form a bundle of, for example, several hundred millimeters. At gap parts 12X (so-called basket holes) formed by the glass fiber bundles 12A and 13A, no glass fiber is present; the gap parts 12X are filled with the insulating resin 14A.

The insulating layer 11B includes glass fiber bundles 12B and 13B, and insulating resin 14B. The glass fiber bundles 12B and 13B are impregnated with the insulating resin 14B. The insulating resin 14B may be made of the same material as that of the insulating resin 14A, and is thus not further described.

The glass fiber bundles 12B having a width of $W_1$ are disposed in a direction parallel to the X axis with intervals of $S_1$. The glass fiber bundles 13B having a width of $W_2$ are disposed in a direction parallel to the Y axis with intervals of $S_2$. The glass fiber bundles 12B and 13B are plain-woven in a lattice-like manner. Details of the glass fiber bundles 12B and 13B are the same as those of the glass fiber bundles 12A and 13A, and are thus not further described. The width $W_1$ may be equal to the width $W_2$, and the interval $S_1$ may be equal to the interval $S_2$.

The glass fiber bundles 12B and 13B are respectively disposed at positions corresponding to the glass fiber bundles 12A and 13A. That is to say, the glass fiber bundles 12B and 13B are respectively disposed at positions overlapping the glass fiber bundles 12A and 13A in a planar view. A planar view refers to viewing an object from a + direction to a − direction (or from a − direction to a + direction) of a Z axis in FIGS. 3 and 4.

As long as the glass fiber bundles 12A and 12B are disposed in parallel by the same pitch in the same direction, the widths and intervals of the glass fiber bundles 12A and 12B do not need to be exactly the same.

Instead of bundling together plural glass fibers to form the glass fiber bundles 12A, fiber bundles may be formed by bundling together carbon fibers, polyester fibers, Tetron fibers, nylon fibers, aramid fibers, or the like. The method of weaving the glass fiber bundles 12A (or other fiber bundles) is not limited to plain-weaving; the fiber bundles may be woven by sateen weaving, twill weaving, or the like.

The wirings 15 and 16 are selectively formed on one side of the insulating layer 11A. The reference 17 is formed on substantially the entire surface of the other side of the insulating layer 11A. The reference 18 is formed on substantially the entire surface of the insulating layer 11B, on the side opposite to that adjacent to the wirings 15 and 16. The wirings 15 and 16 are conducting bodies through which predetermined electric signals flow. The references 17 and 18 are conducting bodies acting as return circuits of the predetermined electric signals flowing through the wirings 15 and 16. The materials of the wiring 15 and the reference 17, etc., are not particularly limited as long as they are conducting bodies. For example, Cu, Al, Au, and Ag may be used.

The wirings 15 and 16 are disposed in parallel, and are differential wirings used for the differential transmission method. The differential transmission method is for transmitting signals using POS signals and NEG signals obtained by inverting POS signals, which are particularly used for high speed transmission. For example, POS signals flow through the wiring 15, and NEG signals flow through the wiring 16 that is disposed in parallel with the wiring 15. High speed transmission is performed with is high performance, as long as there are no inconsistencies in characteristic impedance and no differences in the propagation delay time between the wiring 15 and the wiring 16.

The wirings 15 and 16 are disposed between adjacent glass fiber bundles 12A at positions that do not overlap the glass fiber bundles 12A in a planar view, and between adjacent glass fiber bundles 13A at positions that do not overlap the glass fiber bundles 13A in a planar view. Furthermore, the wirings 15 and 16 are disposed between adjacent glass fiber bundles 12B at positions that do not overlap the glass fiber bundles 12B in a planar view, and between adjacent glass fiber bundles 13B at positions that do not overlap the glass fiber bundles 13B in a planar view. The width of the wirings 15 and 16 may be, for example, 100 μm through 200 μm. The pitch between the wirings 15 and 16 may be, for example, 150 μm through 400 μm.

The width $W_1$ of the glass fiber bundle 12A (width $W_1$ of the glass fiber bundle 12B) and the width $W_2$ of the glass fiber bundle 13A (width $W_2$ of the glass fiber bundle 13B) may be any value, but are preferably narrower than the width of the wirings 15 and 16. More specifically, the width of conventional glass fiber bundles is approximately 300 μm. However, in the present embodiment, the width $W_1$ and the width $W_2$ are preferably narrower than the width of the wirings 15 and 16, at less than or equal to 100 μm, for example.

The interval $S_1$ between the glass fiber bundles 12A (interval $S_1$ between the glass fiber bundles 12B) and the interval $S_2$ between the glass fiber bundles 13A (interval $S_2$ between the glass fiber bundle 13B) are set to be wider than "the width of the wiring 15+the width of the wiring 16+the interval between the wirings 15 and 16". The intervals $S_1$ and $S_2$ may be, for example, 500 μm.

As described above, the intervals $S_1$ and $S_2$ between the glass fiber bundles are set to be wider than "the width of the wiring 15+the width of the wiring 16+the interval between the wirings 15 and 16". Accordingly, the wirings 15 and 16 are disposed between adjacent glass fiber bundles 12A at positions that do not overlap the glass fiber bundles 12A in a planar view, and between adjacent glass fiber bundles 13A at positions that do not overlap the glass fiber bundles 13A in a planar view. Furthermore, the wirings 15 and 16 are disposed between adjacent glass fiber bundles 12B at positions that do not overlap the glass fiber bundles 12B in a planar view, and between adjacent glass fiber bundles 13B at positions that do not overlap the glass fiber bundles 13B in a planar view. Consequently, most parts of the wirings 15 and 16 extend along the insulating resin having a low relative permittivity and excellent transmission properties. Only few parts of the wirings 15 and 16 cross the glass fiber bundles. Therefore, compared to conventional wiring substrates, the impact of differences in the glass fiber density is mitigated, and inconsistencies in characteristic impedance and differences in the propagation delay time are reduced, and high speed transmission is performed with high performance.

Furthermore, the manufacturing cost is prevented from increasing, compared to conventional methods in which an expensive low-dielectric material is used to form the wiring substrate, or the wiring substrate is tilted to laminate layers.

Particularly, by making the widths $W_1$ and $W_2$ of the glass fiber bundles narrower than the width of the wirings 15 and 16, even more parts of the wirings 15 and 16 extend along the insulating resin having a low relative permittivity and excellent transmission properties. Furthermore, even less parts of the wirings 15 and 16 cross the glass fiber bundles. Therefore, the impact of differences in the glass fiber density is mitigated even more, and inconsistencies in characteristic impedance and differences in the propagation delay time are reduced even more, and high speed transmission is performed with high performance.

The intervals $S_1$ and $S_2$ between the glass fiber bundles are set to be wider than "the width of the wiring 15+the width of the wiring 16+the interval between the wirings 15 and 16". However, if the intervals $S_1$ and $S_2$ are too wide, the insulating resin may flow out, and the thickness of the insulating layer may not be properly maintained. Thus, the intervals $S_1$ and $S_2$ are not to excessively wide.

In the wiring substrate 10, the widths of the glass fiber bundles are narrower and the intervals are wider than those of conventional wiring substrates. Therefore, compared to conventional wiring substrates, the wiring substrate 10 includes a smaller amount of glass fiber per unit area and a larger amount of insulating resin per unit area. Accordingly, the strength of the wiring substrate 10 may be insufficient, and the coefficient of thermal expansion may increase. In order to avoid such problems, in the present embodiment, the insulating layers 21A and 21B are provided in the wiring substrate 10. The roles of the insulating layers 21A and 21B are described below.

Figure 5:
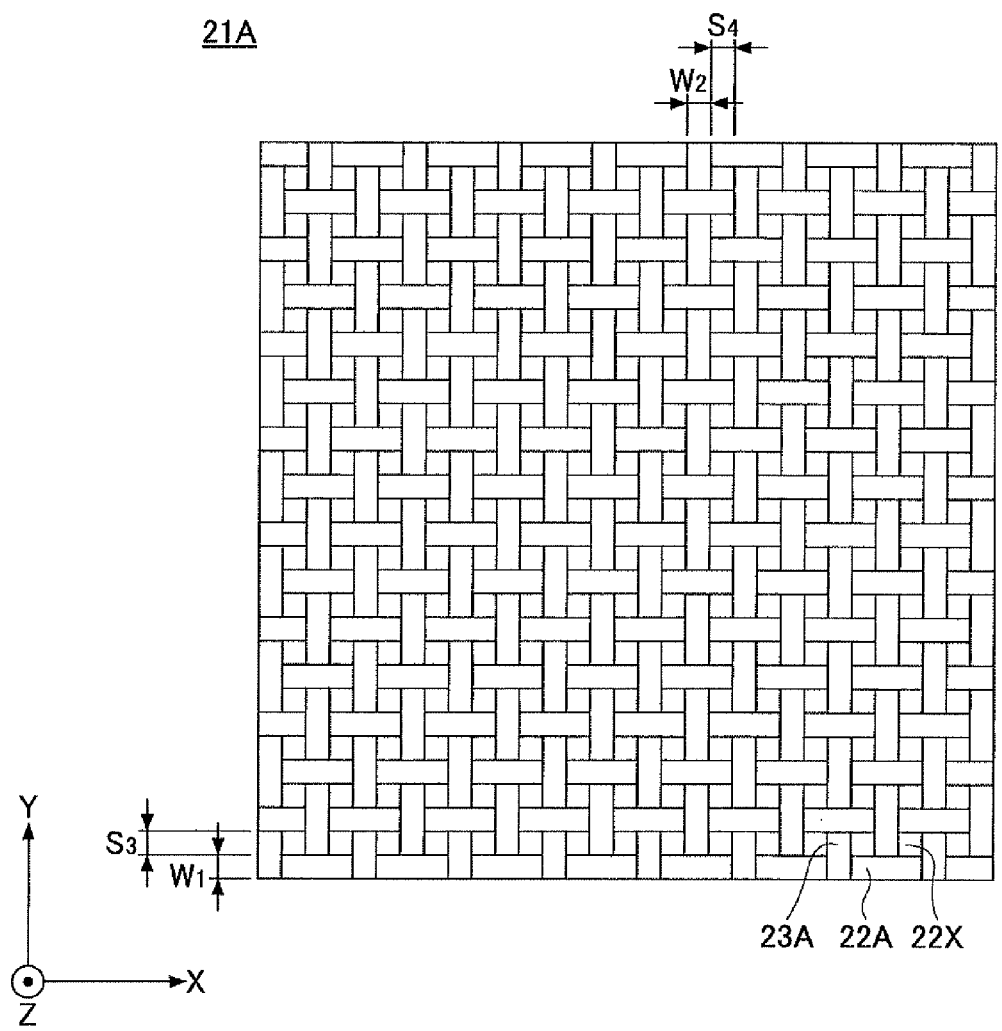
FIG. 5 illustrates examples of glass fiber bundles in an insulating layer.

FIG. 5 illustrates examples of glass fiber bundles in the insulating layer 21A. Referring to FIGS. 4 and 5, the insulating layer 21A includes glass fiber bundles 22A and 23A, and insulating resin 24A. The glass fiber bundles 22A and 23A are impregnated with the insulating resin 24A. The materials of the insulating resin 24A are the same as those of the insulating resin 14A, and are thus not further described.

The glass fiber bundles 22A have the same width $W_1$ as the glass fiber bundles 12A, and are disposed in a direction parallel to the X axis with narrower intervals $S_3$ than those of the glass fiber bundles 12A. The glass fiber bundles 23A have the same width $W_2$ as the glass fiber bundles 13A, and are disposed in a direction parallel to the Y axis with narrower intervals $S_4$ than those of the glass fiber bundles 13A. The glass fiber bundles 22A and the glass fiber bundles 23A are plain-woven in a lattice-like manner. Details of the glass fiber bundles 22A and 23A are the same as those of the glass fiber bundles 12A and 13A, and are thus not further described.

The insulating layer 21B includes glass fiber bundles 22B and 23B, and insulating resin 24B. The glass fiber bundles 22B and 23B are impregnated with the insulating resin 24B. The materials of the insulating resin 24B are the same as those of the insulating resin 14A, etc., and are thus not further described.

The glass fiber bundles 22B have the same width $W_1$ as the glass fiber bundles 12B, and are disposed in a direction parallel to the X axis with narrower intervals $S_3$ than those of the glass fiber bundles 12B. The glass fiber bundles 23B have the same width $W_2$ as the glass fiber bundles 13B, and are disposed in a direction parallel to the Y axis with narrower intervals $S_4$ than those of the glass fiber bundles 13B. The glass fiber bundles 22B and the glass fiber bundles 23B are plain-woven in a lattice-like manner. Details of the glass fiber bundles 22B and 23B are the same as those of the glass fiber bundles 12A and 13A, and are thus not further described. The width $W_1$ may be equal to the width $W_2$, and the interval $S_3$ may be equal to the interval $S_4$.

As described above, the insulating layer 21A includes the glass fiber bundles 22A that have the same width $W_1$ as the glass fiber bundles 12A and that are disposed with narrower intervals $S_3$ than the intervals $S_1$ between the glass fiber bundles 12A, and the glass fiber bundles 23A that have the same width $W_2$ as the glass fiber bundles 13A and that are disposed with narrower intervals $S_4$ than the intervals $S_2$ between the glass fiber bundles 13A. Furthermore, the insulating layer 21B includes the glass fiber bundles 22B that have the same width $W_1$ as the glass fiber bundles 12B and that are disposed with narrower intervals $S_3$ than the intervals $S_1$ between the glass fiber bundles 12B, and the glass fiber bundles 23B that have the same width $W_2$ as the glass fiber bundles 13B and that are disposed with narrower intervals $S_4$ than the intervals $S_2$ between the glass fiber bundles 13B. The glass fiber bundles 22A, 23A, 22B, and 23B are disposed in areas overlapping the gap parts in the insulating layers 11A and 11B (so-called basket holes) in a planar view. Therefore, it is possible to compensate for the decrease in the amount of glass fiber, to prevent the strength of the wiring substrate 10 from decreasing, and to prevent the coefficient of thermal expansion from increasing.

As described above, in the present embodiment, the width $W_1$ of the glass fiber bundles 12A and 12B and the width $W_2$ of the glass fiber bundles 13A and 13B are narrower than those of the conventional technology. Furthermore, the intervals $S_1$ between the glass fiber bundles 12A and 12B and the intervals $S_2$ between the glass fiber bundles 13A and 13B are wider than those of the conventional technology. Furthermore, the wirings 15 and 16 are disposed between adjacent glass fiber bundles 12A at positions that do not overlap the glass fiber bundles 12A in a planar view, and between adjacent glass fiber bundles 13A at positions that do not overlap the glass fiber bundles 13A in a planar view. Furthermore, the wirings 15 and 16 are disposed between adjacent glass fiber bundles 12B at positions that do not overlap the glass fiber bundles 12B in a planar view, and between adjacent glass fiber bundles 13B at positions that do not overlap the glass fiber bundles 13B in a planar view. Consequently, most parts of the wirings 15 and 16 extend along the gap parts (so-called basket holes) filled with the insulating resin having a low relative permittivity and excellent transmission properties. Only few parts of the wirings 15 and 16 cross the glass fiber bundles. Therefore, compared to conventional wiring substrates, in the wiring substrate 10, the impact of differences in the glass fiber density is mitigated, and inconsistencies in characteristic impedance and differences in the propagation delay time are reduced, and high speed transmission is performed with high performance.

Furthermore, in the present embodiment, the insulating layers 21A and 21B having more glass fiber than the insulating layers 11A and 11B are provided adjacent to the insulating layers 11A and 11B, respectively. Consequently, the glass fiber bundles in the insulating layers 21A and 21B are positioned on the gap parts (so-called basket holes) of the insulating layers 11A and 11B. Therefore, it is possible to compensate for the decrease in the amount of glass fiber, to prevent the strength of the wiring substrate 10 from decreasing, and to prevent the coefficient of thermal expansion from increasing.

Furthermore, the difference in the propagation delay time (difference between the propagation delay time of the wiring 15 and the propagation delay time of the wiring 16) in the wiring substrate 10 according to the present embodiment was measured, and the measurement result was 5 ps/100 mm. Meanwhile, the difference in the propagation delay time in the conventional wiring substrate 100 was measured, and the measurement result was 7 ps/100 mm. Accordingly, it was found that in the wiring substrate 10 according to the present embodiment, the difference in the propagation delay time is reduced by approximately 30% compared to that of the conventional wiring substrate 100.

Modification 1 of First Embodiment

Figure 6:
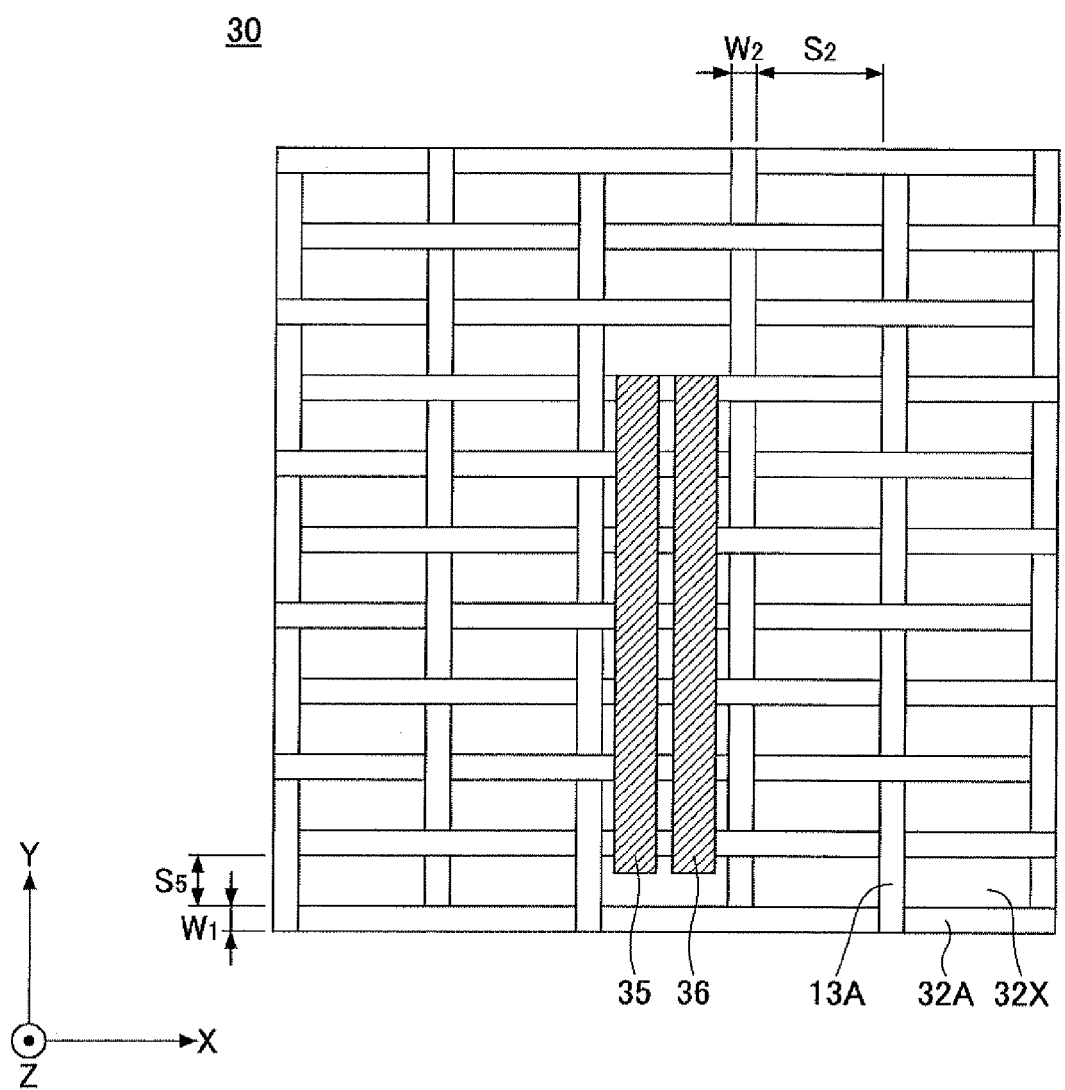
FIG. 6 is a transparent plan view of main parts of a wiring substrate according to modification 1 of the first embodiment.

FIG. 6 is a transparent plan view of main parts of a wiring substrate according to modification 1 of the first embodiment. A wiring substrate 30 illustrated in FIG. 6 is different from the wiring substrate 10 illustrated in FIGS. 3 and 4 in that the glass fiber bundles 12A is replaced with glass fiber bundles 32A and glass fiber bundles 12B are replaced with glass fiber bundles 32B (not illustrated), and the wirings 15 and 16 are respectively replaced with wirings 35 and 36. The following mainly describes the features of the wiring substrate 30 that are different from those of the wiring substrate 10, and other features are not further described.

The width $W_1$ of the glass fiber bundles 32A and 32B are the same as those of the glass fiber bundles 12A and 12B. Furthermore, intervals $S_5$ between the glass fiber bundles 32A and 32B are narrower than the intervals $S_1$ between the glass fiber bundles 12A and 12B. The glass fiber bundles 32B (not illustrated) are disposed at positions corresponding to the glass fiber bundles 32A. That is to say, the glass fiber bundles 32B are provided at positions overlapping the glass fiber bundles 32A in a planar view. The wirings 35 and 36 extend in parallel only in the Y axis direction, and are disposed between adjacent glass fiber bundles 13A at positions that do not overlap the glass fiber bundles 13A in a planar view, and between adjacent glass fiber bundles 13B at positions that do not overlap the glass fiber bundles 13B in a planar view.

As described above, when the wirings 35 and 36, which are differential wirings, are extending in parallel only in one direction, the wiring substrate 30 may have the following configuration. That is, the intervals between glass fiber bundles in only one direction are to be set to be wider than "the width of the wiring 35+the width of the wiring 36+the interval between the wirings 35 and 36", so that the wirings 35 and 36 are disposed between adjacent glass fiber bundles 13A at positions that do not overlap the glass fiber bundles 13A in a planar view, and between adjacent glass fiber bundles 13B at positions that do not overlap the glass fiber bundles 13B in a planar view. Consequently, most parts of the wirings 35 and 36 extend along the insulating resin having a low relative permittivity and excellent transmission properties. Only few parts of the wirings 35 and 36 cross the glass fiber bundles. Therefore, compared to conventional wiring substrates, the impact of differences in the glass fiber density is mitigated, and inconsistencies in characteristic impedance and differences in the propagation delay time are reduced, and high speed transmission is performed with high performance.

However, more parts of the wirings 35 and 36 cross the glass fiber bundles compared to the case of the wiring substrate 10 illustrated in FIG. 3. Therefore, the first embodiment is more preferable for further mitigating the inconsistencies in characteristic impedance and the impact of differences in the glass fiber density.

Modification 2 of First Embodiment

Figure 7:
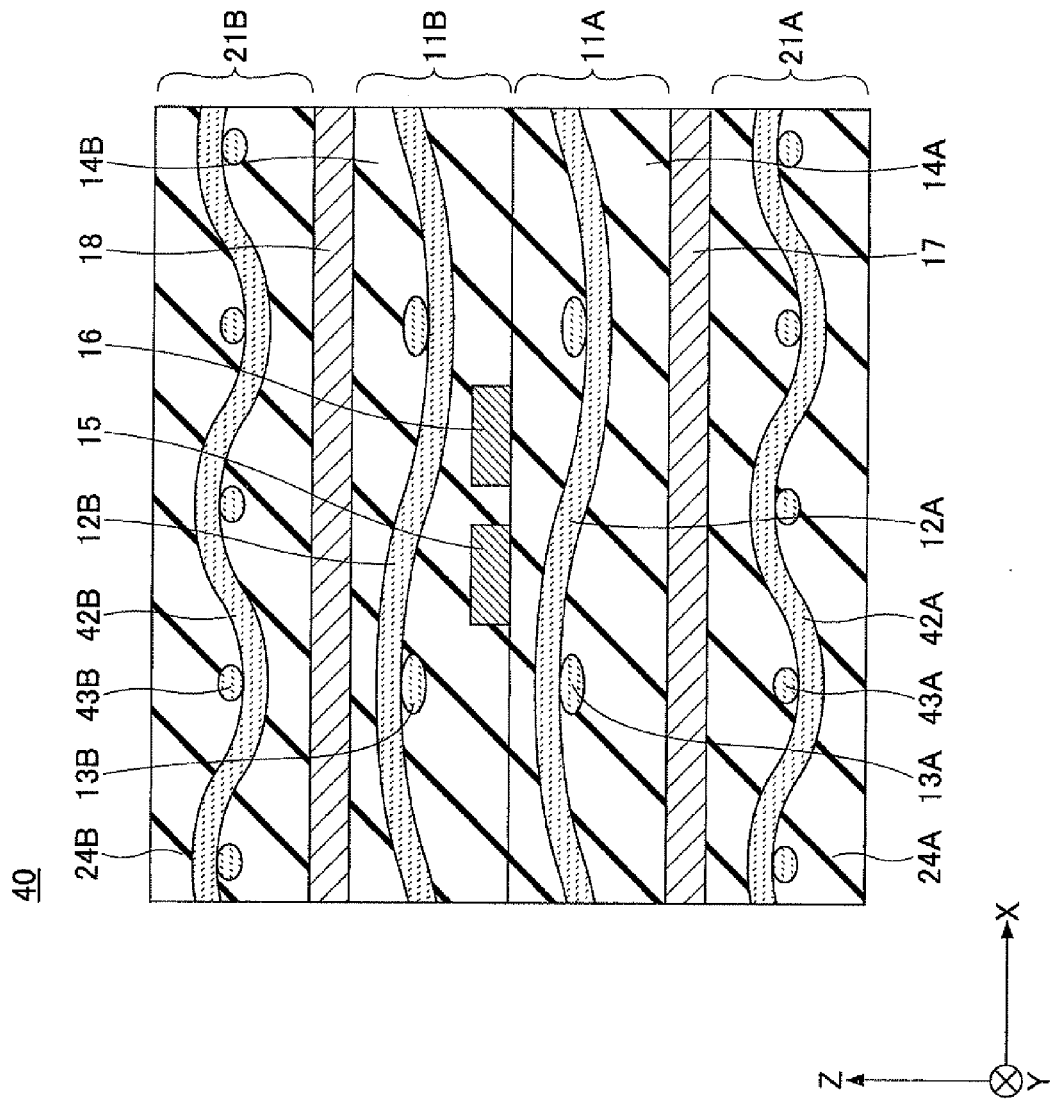
FIG. 7 is a cross-sectional view of main parts of a wiring substrate according to modification 2 of the first embodiment.

FIG. 7 is a cross-sectional view of main parts of the wiring substrate according to modification 2 of the first embodiment. A wiring substrate 40 illustrated in FIG. 7 is different from the wiring substrate 10 illustrated in FIGS. 3 and 4 in that the glass fiber bundles 22A, 23A, 22B, and 23B are replaced by glass fiber bundles 42A, 43A, 42B, and 43B, respectively. The following mainly describes the features of the wiring substrate 40 that are different from those of the wiring substrate 10, and other features are not further described.

The widths of the glass fiber bundles 42A and 43A are narrower than the width $W_1$ and the width $W_2$ of the glass fiber bundles 12A and 13A, respectively. The widths of the glass fiber bundles 42B and 43B are narrower than the width $W_1$ and the width $W_2$ of the glass fiber bundles 12B and 13B, respectively.

By making the glass fiber bundles 42A, 43A, 42B, and 43B have narrow widths, inconsistencies in the characteristic impedance and differences in the propagation delay time are mitigated even further compared to the first embodiment. That is to say, the glass fiber bundles 42A, 43A, 42B, and 43B are further away from the wirings 15 and 16 than are the glass fiber bundles 12A, 13A, 12B, and 13B. Therefore, the glass fiber bundles 42A, 43A, 42B, and 43B have a relatively small impact on inconsistencies in the characteristic impedance and differences in the propagation delay time. However, when the insulating layers 11A and 11B are relatively thin, the glass fiber bundles 42A, 43A, 42B, and 43B may have an impact on the inconsistencies in the characteristic impedance and differences in the propagation delay time. In this case, by making the glass fiber bundles 42A, 43A, 42B, and 43B have narrower widths, the inconsistencies in the characteristic impedance and differences in the propagation delay time are further mitigated compared to the case of the first embodiment.

Even when the glass fiber bundles 42A, 43A, 42B, and 43B are made to have narrower widths, glass fiber bundles are disposed on the gap parts (so-called basket holes) in the insulating layers 11A and 11B. Therefore, it is still possible to compensate for the decrease in the amount of glass fiber, to prevent the strength of the wiring substrate 40 from decreasing, and to prevent the coefficient of thermal expansion from increasing.

Modification 3 of First Embodiment

Figure 8:
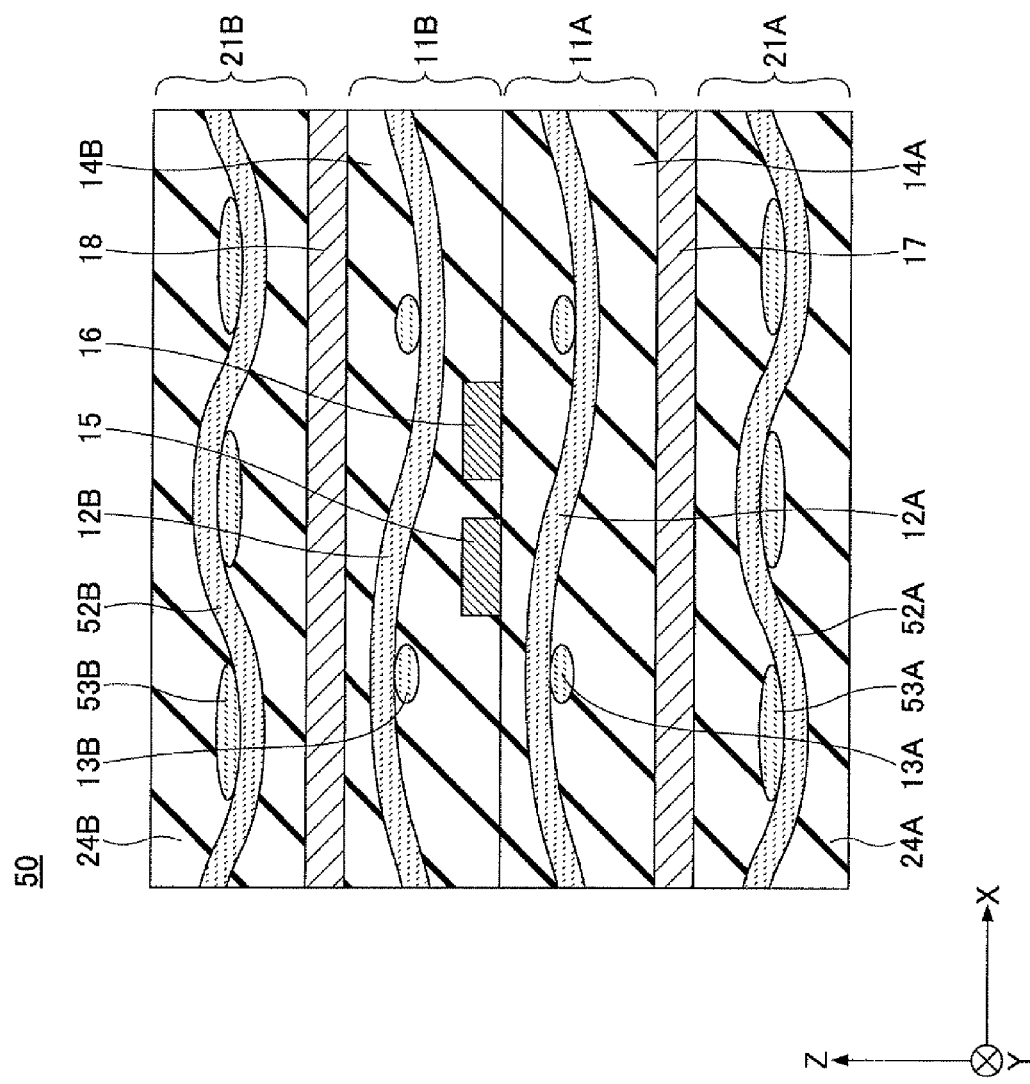
FIG. 8 is a cross-sectional view of main parts of a wiring substrate according to modification 3 of the first embodiment.

FIG. 8 is a cross-sectional view of main parts of the wiring substrate according to modification 3 of the first embodiment. A wiring substrate 50 illustrated in FIG. 8 is different from the wiring substrate 10 illustrated in FIGS. 3 and 4 in that the glass fiber bundles 22A, 23A, 22B, and 23B are replaced by glass fiber bundles 52A, 53A, 52B, and 53B, respectively. The following mainly describes the features of the wiring substrate 50 that are different from those of the wiring substrate 10, and other features are not further described.

The widths of the glass fiber bundles 52A and 53A are wider than the width $W_1$ and the width $W_2$ of the glass fiber bundles 12A and 13A, respectively. The widths of the glass fiber bundles 52B and 53B are wider than the width $W_1$ and the width $W_2$ of the glass fiber bundles 12B and 13B, respectively.

When the insulating layers 11A and 11B are relatively thick, the glass fiber bundles 52A, 53A, 52B, and 53B are unlikely to have an impact on the inconsistencies in the characteristic impedance and differences in the propagation delay time. In this case, as illustrated in FIG. 8, the widths of the glass fiber bundles 52A, 53A, 52B, and 53B may be relatively wide. By making the glass fiber bundles 52A, 53A, 52B, and 53B have wide widths, the strength of the wiring substrate 10 may be efficiently prevented from decreasing, and the coefficient of thermal expansion may be efficiently prevented from increasing.

Second Embodiment

Figure 9:
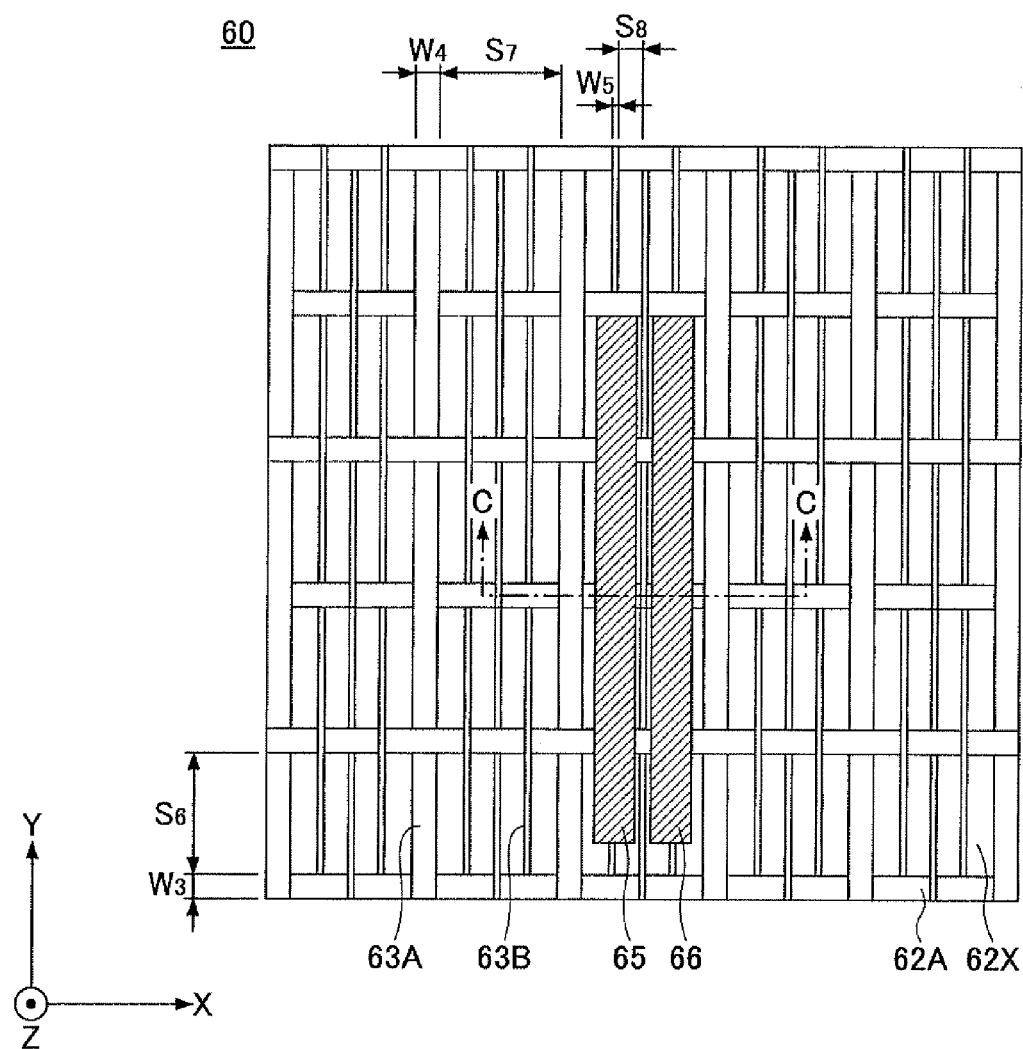
FIG. 9 is a transparent plan view of main parts of a wiring substrate according to a second embodiment.
Figure 10:
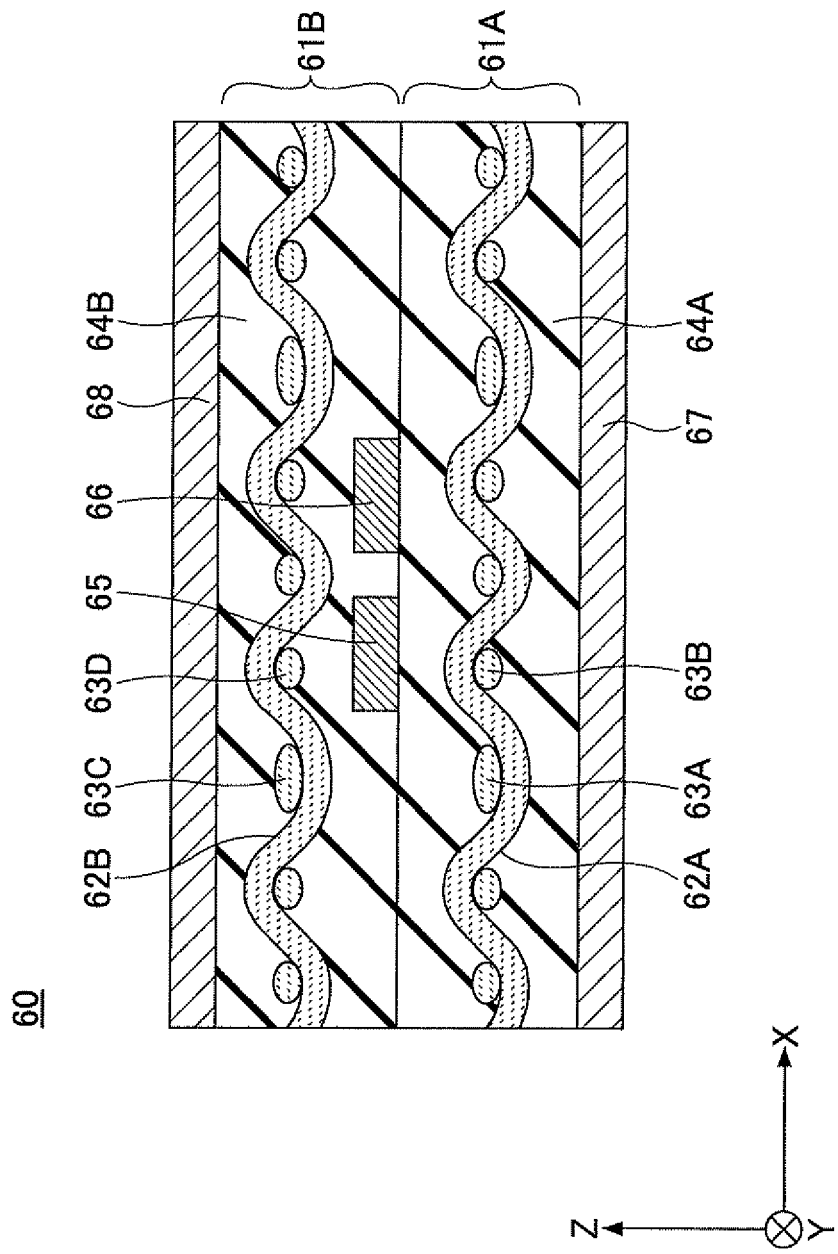
FIG. 10 is a cross-sectional view of main parts of the wiring substrate according to the second embodiment.

FIG. 9 is a transparent plan view of main parts of a wiring substrate according to a second embodiment. FIG. 10 is a cross-sectional view of main parts of the wiring substrate according to the second embodiment. Some of the elements illustrated in FIG. 10 are not illustrated in FIG. 9. FIG. 10 is a cross-sectional view cut along a line C-C in FIG. 9. As illustrated in FIGS. 9 and 10, a reference 67, an insulating layer 61A, wirings 65 and 66, an insulating layer 61B, and a reference 68 are laminated in a wiring substrate 60. A detailed description is given of the respective components of the wiring substrate 60.

The insulating layer 61A includes glass fiber bundles 62A, 63A, and 63B, and insulating resin 64A. The glass fiber bundles 62A, 63A, and 63B are impregnated by the insulating resin 64A. The materials of the insulating resin 64A are the same as those of the insulating resin 14A, and are thus not further described.

The glass fiber bundles 62A having a width of $W_3$ are disposed in a direction parallel to an X axis with intervals of $S_6$. The glass fiber bundles 63A having a width of $W_4$ are disposed in a direction parallel to a Y axis with intervals of $S_7$. In between adjacent glass fiber bundles 63A, the glass fiber bundles 63B having a width of $W_5$ are disposed in a direction parallel to the Y axis with intervals of $S_8$. The glass fiber bundles 62A, 63A, and 63B are plain-woven in a lattice-like manner. Each of the glass fiber bundles 62A, 63A, and 63B is formed by bundling together plural glass fibers of, for example, several millimeters. At gap parts 62X (so-called basket holes) formed by the glass fiber bundles 62A and the glass fiber bundles 63A or 63B, no glass fiber is present; the gap parts 12X are filled with the insulating resin 64A. The width $W_4$ is wider than the width $W_5$, and the interval $S_7$ is wider than the interval $S_8$.

The insulating layer 61B includes glass fiber bundles 62B, 63C, and 63D, and insulating resin 64B. The glass fiber bundles 62B, 63C, and 63D are impregnated by the insulating resin 64B. The materials of the insulating resin 64B are the same as those of the insulating resin 14A, and are thus not further described.

The glass fiber bundles 62B having a width of $W_3$ are disposed in a direction parallel to the X axis with intervals of $S_6$. The glass fiber bundles 63C having a width of $W_4$ are disposed in a direction parallel to the Y axis with intervals of $S_7$. In between adjacent glass fiber bundles 63C, the glass fiber bundles 63D having a width of $W_5$ are disposed in a direction parallel to the Y axis with intervals of $S_8$. The glass fiber bundles 62B, 63C, and 63D are plain-woven in a lattice-like manner. Details of the glass fiber bundles 62B, 63C, and 63D are the same as those of the glass fiber bundles 62A, 63A, and 63B, and are thus not further described. The width $W_3$ may be equal to the width $W_4$, and the interval $S_6$ may be equal to the interval $S_7$.

The glass fiber bundles 62B, 63C, and 63D are disposed at positions corresponding to the glass fiber bundles 62A, 63A, and 63B. That is to say, the glass fiber bundles 62B, 63C, and 63D are disposed at positions overlapping the glass fiber bundles 62A, 63A, and 63B in a planar view.

The wirings 65 and 66 are selectively formed on one side of the insulating layer 61A. The reference 67 is formed on substantially the entire surface of the other side of the insulating layer 61A. The reference 68 is formed on substantially the entire surface of the insulating layer 61B, on the side opposite to that adjacent to the wirings 65 and 66. The wirings 65 and 66 are conducting bodies through which predetermined electric signals flow. The references 67 and 68 are conducting bodies acting as return circuits of the predetermined electric signals flowing through the wirings 65 and 66. The wirings 65 and 66 correspond to differential signals. The materials of the wiring 65, etc., are the same as that of the wiring 15, etc., and are thus not further described.

The width $W_3$ of the glass fiber bundle 62A (width $W_3$ of the glass fiber bundle 62B) and the width $W_4$ of the glass fiber bundle 63A (width $W_4$ of the glass fiber bundle 63B) may be any value, but are preferably narrower than the width of the wirings 65 and 66. More specifically, the width of conventional glass fiber bundles is approximately 300 μm. However, in the present embodiment, the width $W_3$ and the width $W_4$ are preferably narrower than the width of the wirings 65 and 66, at less than or equal to 100 μm, for example.

The interval $S_7$ between the glass fiber bundles 63A (interval $S_7$ between the glass fiber bundles 63C) is set to be wider than "the width of the wiring 65+the width of the wiring 66+the interval between the wirings 65 and 66". The interval $S_7$ may be, for example, 800 μm.

The width $W_5$ of the glass fiber bundle 63B (width $W_5$ of the glass fiber bundle 63D) is set to be narrower than the width of the wirings 65 and 66. The width $W_5$ may be, for example, less than or equal to 100 μm. The interval $S_8$ between the glass fiber bundles 63B (interval $S_8$ between the glass fiber bundle 63D) is set, for example, such that the interval $S_7$ between the glass fiber bundles 63A (interval $S_7$ between the glass fiber bundles 63C) is evenly divided. The number of glass fiber bundles 63B and 63D is not limited to three and may be any number.

As described above, the interval $S_7$ between the glass fiber bundles 63A are set to be wider than "the width of the wiring 65+the width of the wiring 66+the interval between the wirings 65 and 66". Accordingly, the wirings 65 and 66 are disposed between adjacent glass fiber bundles 63A at positions that do not overlap the glass fiber bundles 63A in a planar view, and between adjacent glass fiber bundles 63C at positions that do not overlap the glass fiber bundles 63C in a planar view.

Consequently, most parts of the wirings 65 and 66 extend along the gap parts (so-called basket holes) filled with the insulating resin having a low relative permittivity and excellent transmission properties. Only few parts of the wirings 65 and 66 cross the glass fiber bundles. Therefore, compared to conventional wiring substrates, in the wiring substrate 60, the impact of differences in the glass fiber density is mitigated, and inconsistencies in characteristic impedance and differences in the propagation delay time are reduced, and high speed transmission is performed with high performance.

Particularly, by making the width $W_3$ of the glass fiber bundle 62A narrower than the widths of the wirings 65 and 66, even more parts of the wirings 65 and 66 extend along the insulating resin having a low relative permittivity and excellent transmission properties. Furthermore, even less parts of the wirings 65 and 66 cross the glass fiber bundles. Therefore, the impact of differences in the glass fiber density is mitigated even more, and inconsistencies in characteristic impedance and differences in the propagation delay time are reduced even more, and high speed transmission is performed with high performance.

Furthermore, the glass fiber bundles 63B having a narrower width than the glass fiber bundles 63A are disposed between adjacent glass fiber bundles 63A, and the glass fiber bundles 63D having a narrower width than the glass fiber bundles 63C are disposed between adjacent glass fiber bundles 63C. Therefore, it is possible to compensate for the decrease in the amount of glass fiber, to prevent the strength of the wiring substrate 60 from decreasing, and to prevent the coefficient of thermal expansion from increasing. The width $W_5$ of the glass fiber bundles 63B and 63D are narrower than the widths of the wirings 65 and 66, and therefore high speed transmission is unaffected.

Figure 11:
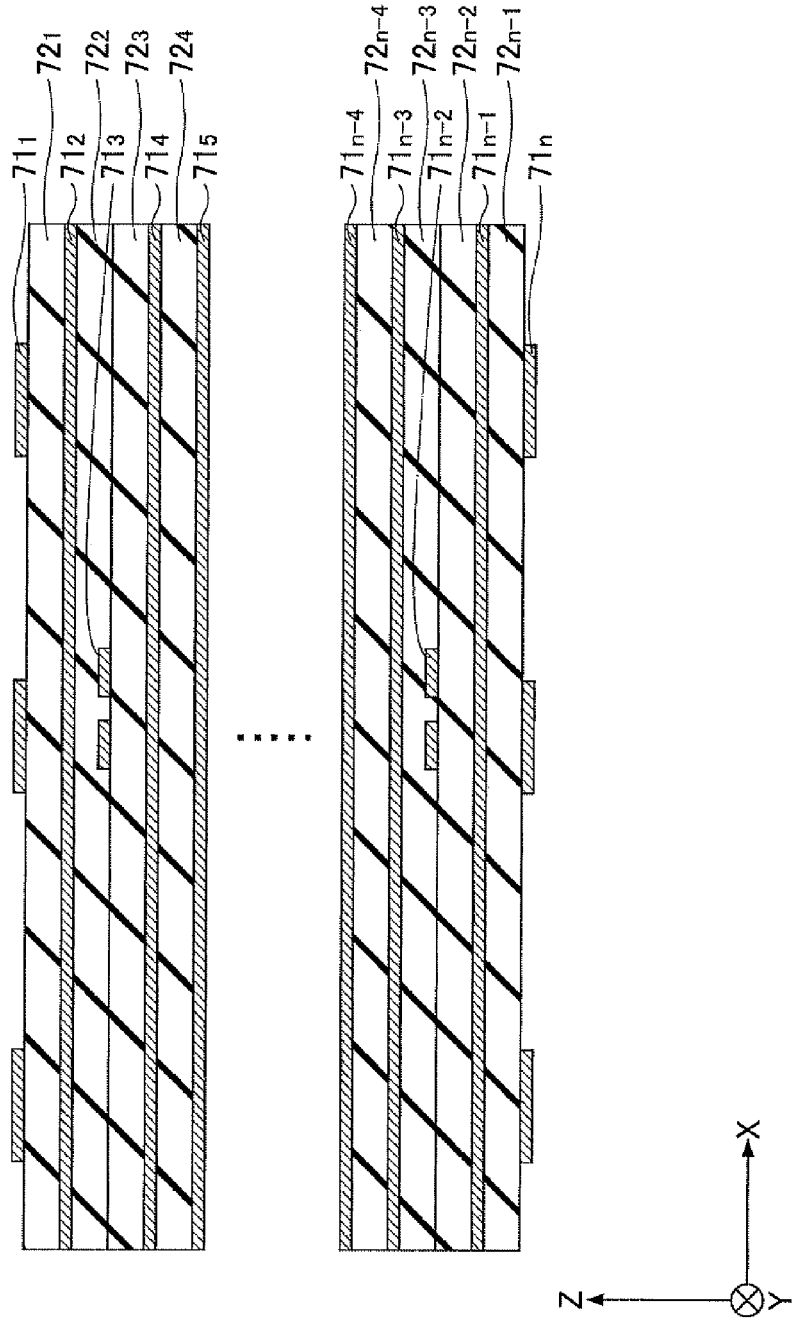
FIG. 11 is for describing a wiring substrate including multiple layers.

As illustrated in FIG. 11, a wiring substrate 70 includes multiple wiring layers $71_1$ through $71_n$ that are laminated via insulating layers $72_1$ through $72_{n-1}$ in which glass fiber bundles (not illustrated) are woven in a lattice-like manner. In this case, not all of the wiring layers and insulating layers need to have the configuration of the first or second embodiments. For example, if the wiring layer $71_3$ is the wiring layer with differential wirings, the configuration illustrated in FIG. 4 is only applied to the wiring layer $71_3$ and the insulating layers $72_1$ through $72_4$. The widths and intervals of the glass fiber bundles in the other insulating layers do not affect the high speed transmission in the differential wirings in the wiring layer $71_3$. Therefore, the widths and intervals of the glass fiber bundles in the other insulating layers may be appropriately set in consideration of preventing the strength of the wiring substrate 70 from decreasing, and preventing the coefficient of thermal expansion from increasing.

When the wiring layer $71_3$ is the wiring layer with the differential wirings, the configuration illustrated in FIG. 10 is only applied to the wiring layer $71_3$ and the insulating layers insulating layers $72_2$ and $72_3$. The widths and intervals of the glass fiber bundles in the other insulating layers do not affect the high speed transmission in the differential wirings in the wiring layer $71_3$. Therefore, the widths and intervals of the glass fiber bundles in the other insulating layers may be appropriately set in consideration of preventing the strength of the wiring substrate 70 from decreasing, and preventing the coefficient of thermal expansion from increasing.

Manufacturing Method of Wiring Substrate

Next, a description is given of a manufacturing method of the wiring substrate 10 illustrated in FIGS. 3 and 4, with reference to FIGS. 12 through 19. In the following, a description is given only of laminating/forming the reference 17, the insulating layer 11A, the wirings 15 and 16, and the insulating layer 11B. The other elements may be manufactured by the same method.

Figure 12:
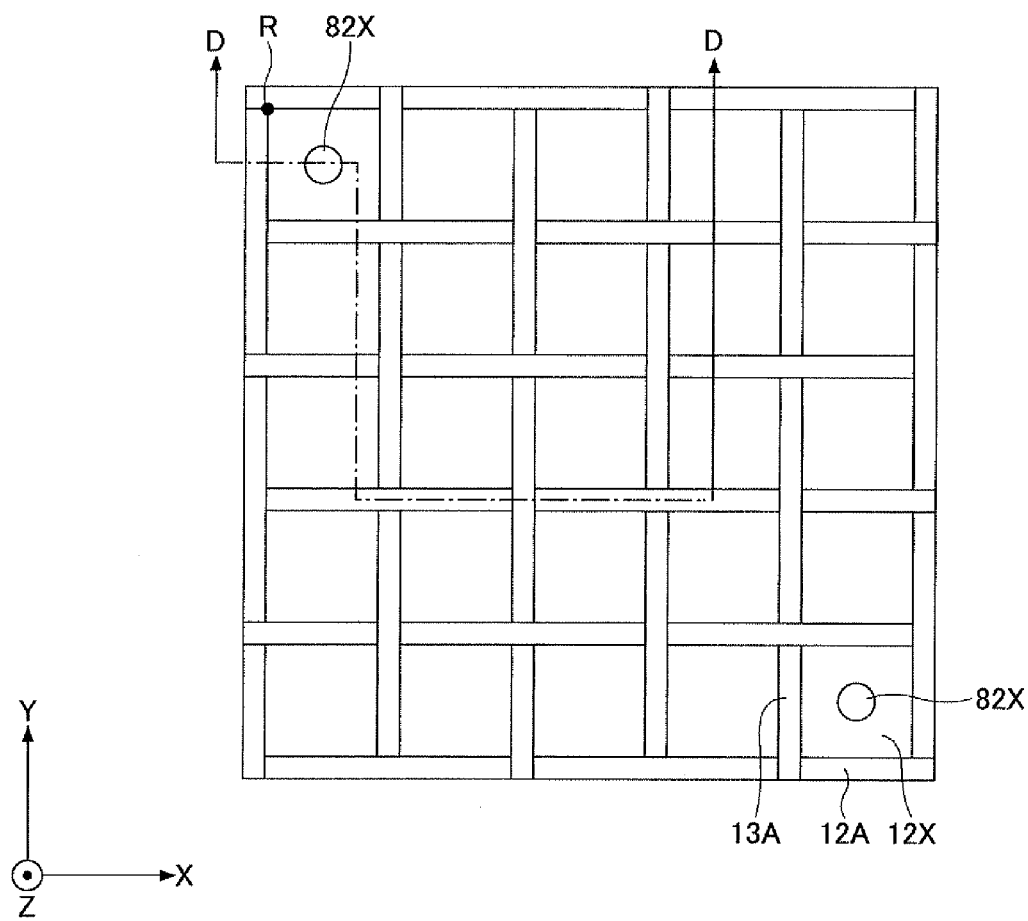
FIG. 12 is for describing a manufacturing method of the wiring substrate illustrated in FIGS. 3 and 4 (part 1)
Figure 13:
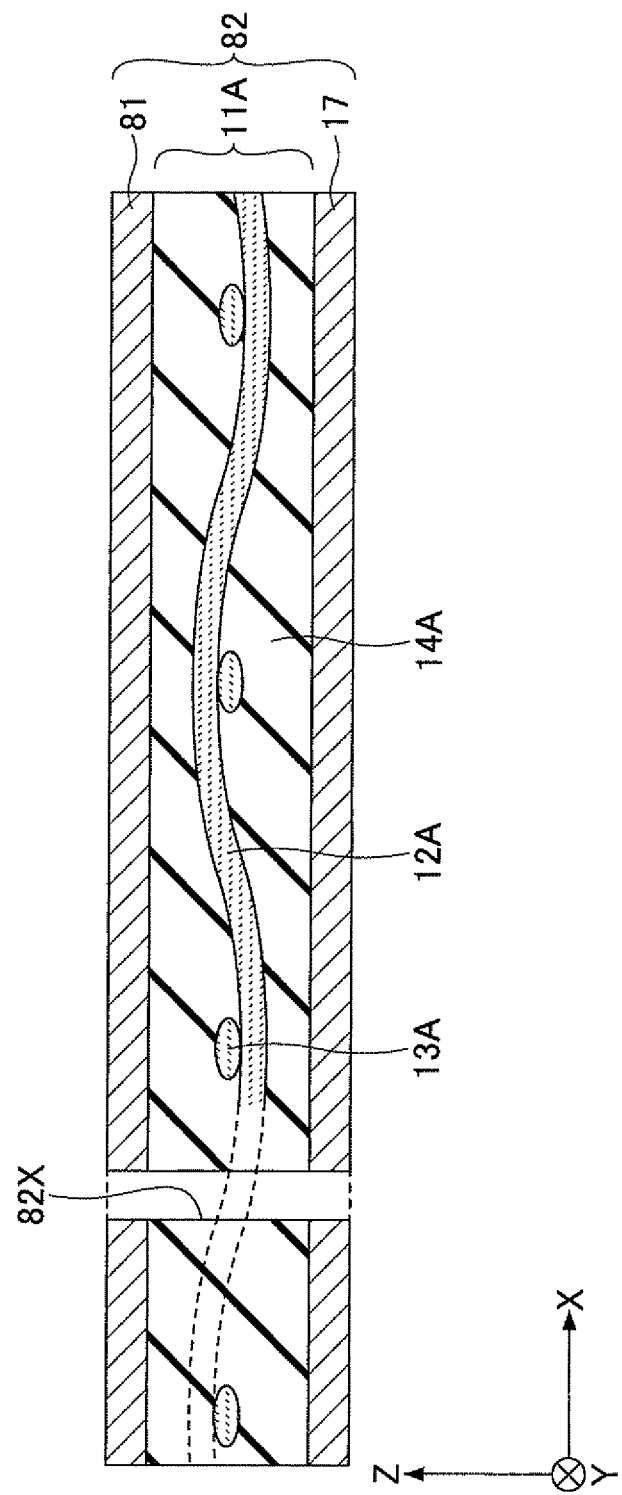
FIG. 13 is for describing the manufacturing method of the wiring substrate illustrated in FIGS. 3 and 4 (part 2)

First, as illustrated in FIGS. 12 and 13, a core layer 82 is prepared by forming solid copper foil 17 and 81 as wiring layers on both sides of the insulating layer 11A. Then, reference holes 82X are formed in the core layer 82. For example, two reference holes 82X are formed in opposing corners. FIG.

12 is a transparent plan view, and FIG. 13 is a cross-sectional view cut along a line C-C in FIG. 12. Some of the elements illustrated in FIG. 13 are not illustrated in FIG. 12. The solid copper foil 17 corresponds to the reference 17 described above.

Specifically, for example, an X ray is radiated onto the core layer 82 to recognize the positions of the glass fiber bundles 12A and 13A, and an origin position R is determined. The origin position R may be any position; however, in this case, one of the apexes of the gap parts 12X formed by the glass fiber bundles 12A and 13A is determined as the origin position R. Next, the reference holes 82X that pass through the core layer 82 are formed at predetermined positions by using the determined origin position R as a reference. Information relevant to the widths and intervals of the glass fiber bundles 12A and 13A is recognized in advance as design information. Therefore, it is possible to calculate coordinates of an area where the glass fiber bundles 12A and 13A are located, with respect to the reference hole 82X.

Figure 14:
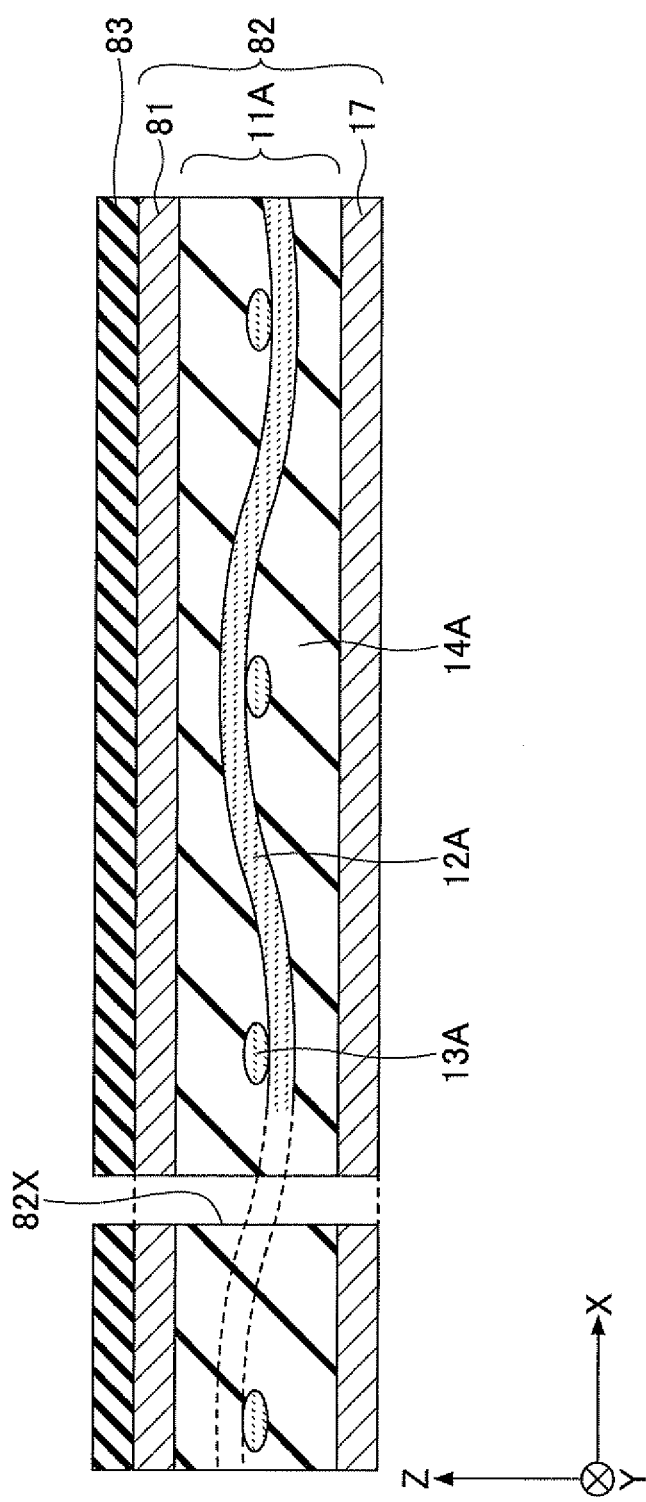
FIG. 14 is for describing the manufacturing method of the wiring substrate illustrated in FIGS. 3 and 4 (part 3)
Figure 15:
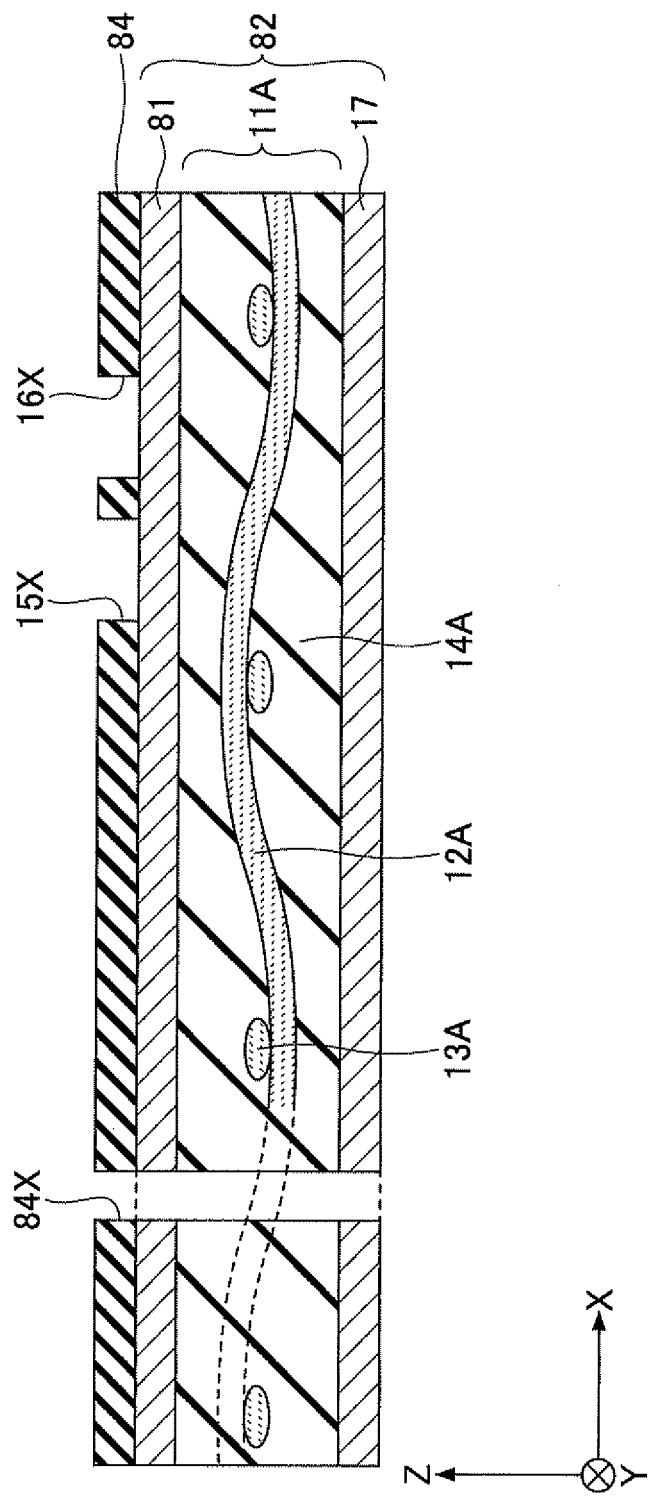
FIG. 15 is for describing the manufacturing method of the wiring substrate illustrated in FIGS. 3 and 4 (part 4)

Next, the wirings 15 and 16 which are differential wirings are formed. Specifically, as illustrated in FIG. 14, a resist layer 83 is formed on the solid copper foil 81 which is the wiring layer. Then, as illustrated in FIG. 15, a mask 84 is positioned on the resist layer 83. The mask 84 includes positioning holes 84X (reference marks) corresponding to the reference holes 82X of the core layer 82, and openings 15X and 16X corresponding to the wirings 15 and 16. The positioning holes 84X and the openings 15X and 16X are formed in advance. As described above, the coordinates of the area where the glass fiber bundles 12A and 13A are located with respect to the reference hole 82X are calculated in advance. Therefore, the mask 84 is fabricated such that the openings 15X and 16X are positioned between adjacent glass fiber bundles 12A or between adjacent glass fiber bundles 13A, when the positioning holes 84X are positioned to match the positions of the reference holes 82X.

Figure 16:
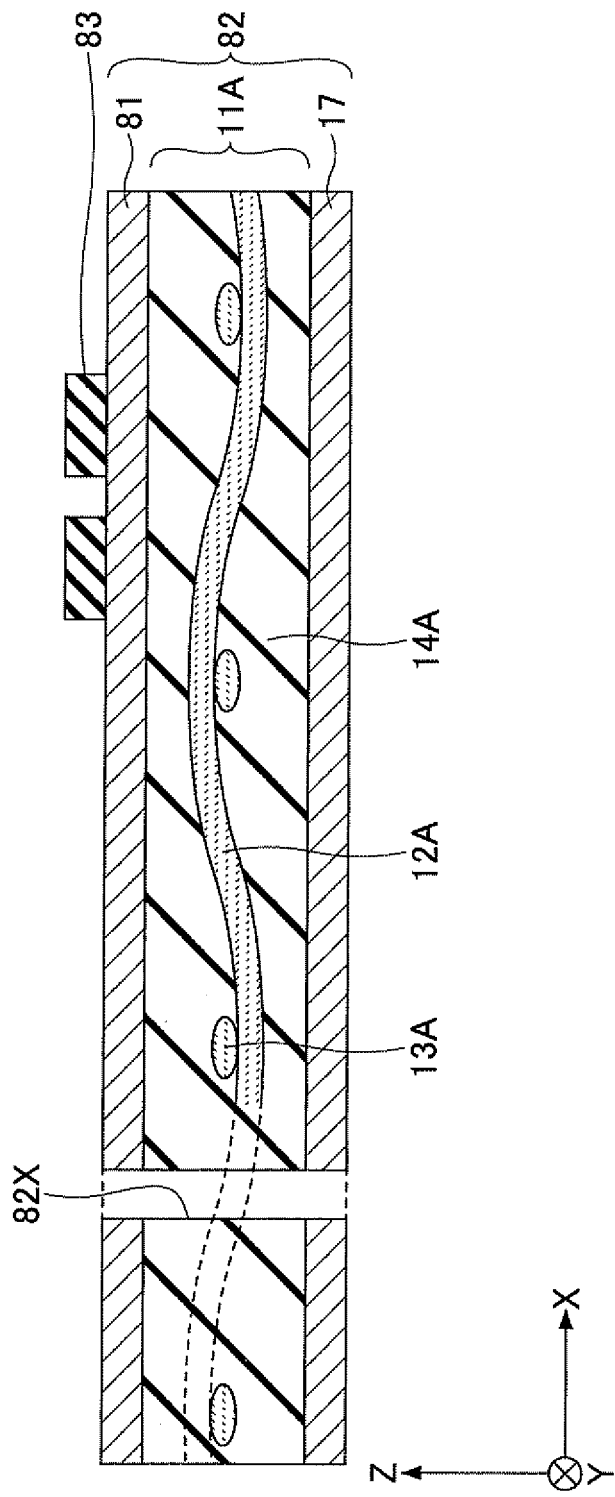
FIG. 16 is for describing the manufacturing method of the wiring substrate illustrated in FIGS. 3 and 4 (part 5)
Figure 17:
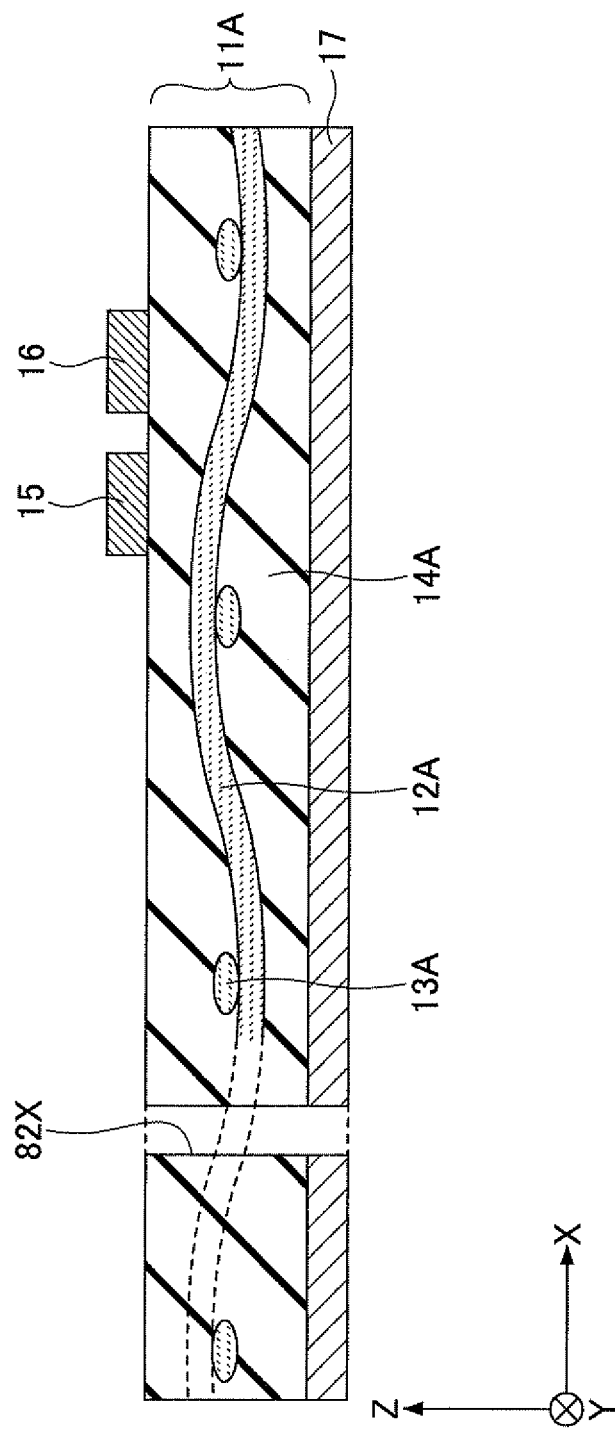
FIG. 17 is for describing the manufacturing method of the wiring substrate illustrated in FIGS. 3 and 4 (part 6)

Next, the resist layer 83 is exposed and developed via the mask 84. Accordingly, as illustrated in FIG. 16, the resist layer 83 is partially removed so that the resist layer 83 only remains at positions corresponding to where the wirings 15 and 16 are formed on the solid copper foil 81. Then, as illustrated in FIG. 17, the resist layer 83 is used as a mask to perform etching on the solid copper foil 81. Subsequently, the resist layer 83 is removed, so that the wirings 15 and 16 are formed.

Figure 18:
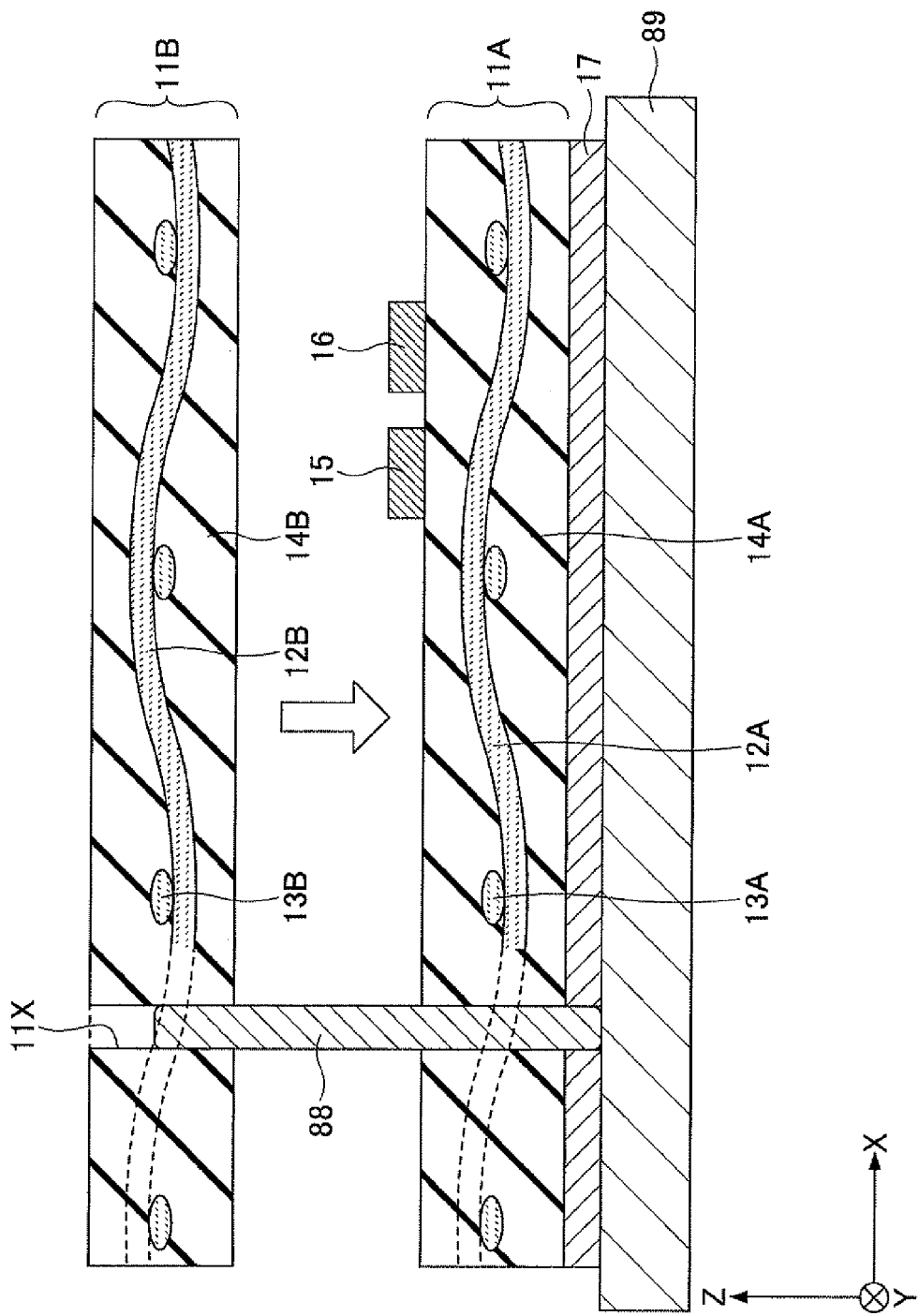
FIG. 18 is for describing the manufacturing method of the wiring substrate illustrated in FIGS. 3 and 4 (part 7)
Figure 19:
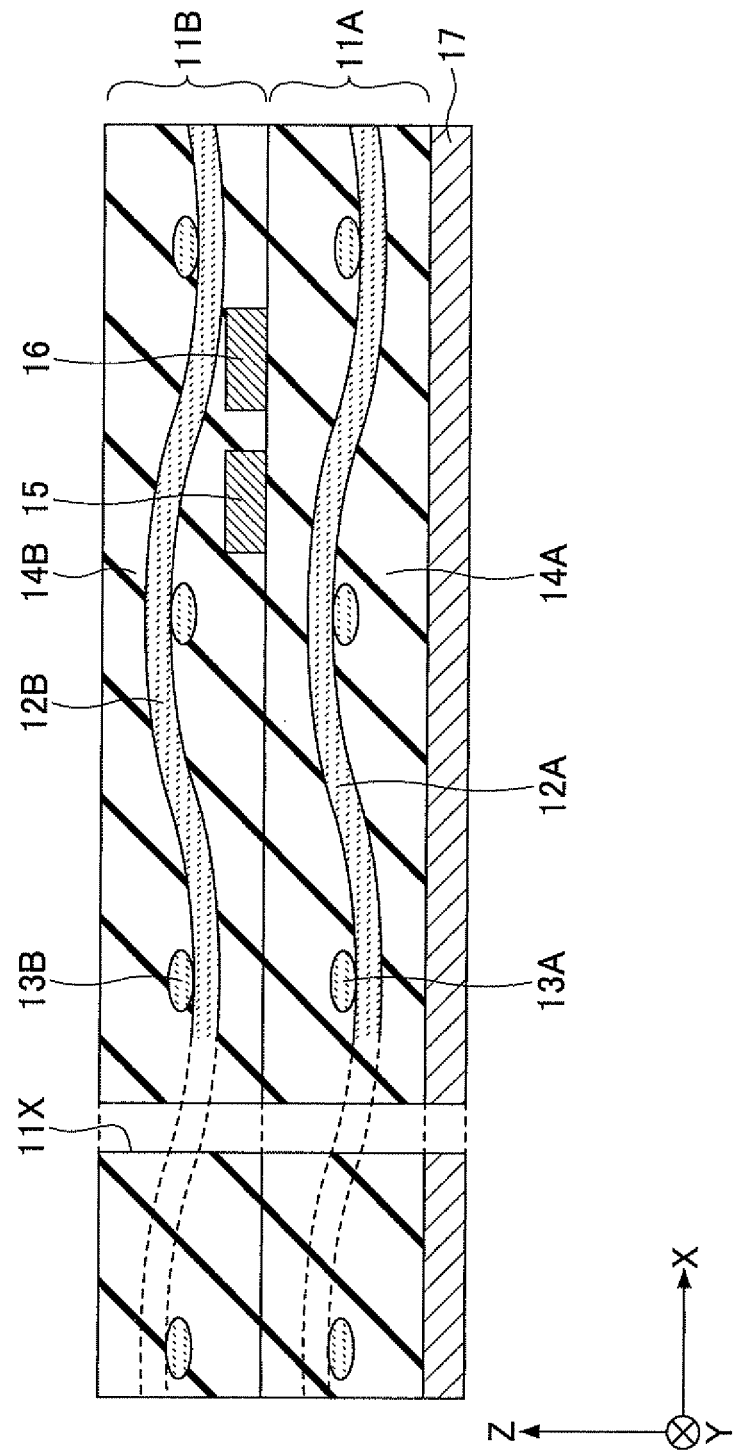
FIG. 19 is for describing the manufacturing method of the wiring substrate illustrated in FIGS. 3 and 4 (part 8).

Next, the insulating layer 11B is prepared, and reference holes 11X are formed (at two positions) at the same positions as the reference holes 82X of the core layer 82 illustrated in FIGS. 12 and 13. That is to say, the positions of the reference holes 11X are formed such that when the reference holes 11X are positioned to match the positions of the reference holes 82X, the center positions of the glass fiber bundles 12A and the center positions of the glass fiber bundles 12B match each other and the center positions of the glass fiber bundles 13A and the center positions of the glass fiber bundles 13B match each other. Then, by performing pin lamination, the positions of the core layer 82 and insulating layer 11B are matched. Specifically, as illustrated in FIG. 18, a mounting part 89 provided with positioning pins 88 is used to position the core layer 82 and the insulating layer 11B, and the insulating layer 11B is fixed on the core layer 82. The mounting part 89 is provided with two positioning pins 88 provided at positions corresponding to the two reference holes 82X of the insulating layer 11A illustrated in FIGS. 12 and 13, and at positions corresponding to the two reference holes 11X of the insulating layer 11B. Subsequently, the core layer 82 and the insulating layer 11B are removed from the mounting part 89 provided with the positioning pin 88, so that a laminated body including the insulating layer 11B fixed on the core layer 82 is formed as illustrated in FIG. 19.

As described above, an X ray is radiated onto the insulating layer to recognize the positions of the glass fiber bundles and determine the origin position R. By using the determined origin position R as a reference, reference holes are formed at predetermined positions to pass through the insulating film. It is possible to recognize the positions of the glass fiber bundles with respect to the reference holes, and therefore differential wirings are formed between adjacent glass fiber bundles. Then, the same method is performed to form reference holes in another insulating layer. Then, the other insulating layer is positioned on the insulating layer with differential wirings by pin lamination, and the other insulating layer is laminated onto the insulating layer with differential wirings. Consequently, on the insulating layer with the differential wirings, the differential wirings are disposed between two adjacent glass fiber bundles at positions that do not overlap the glass fiber bundles in a planar view. Furthermore, the differential wirings are disposed between two adjacent glass fiber bundles of the other insulating layer at positions that do not overlap the glass fiber bundles of the other insulating layer in a planar view.

Furthermore, when the insulating layer 21A is laminated on the laminated body in which the insulating layer 11B is fixed on the core layer 82, the positional relationships between the glass fiber bundles 12A and 13A and the glass fiber bundles 22A and 23A are not that important. The glass fiber bundles 22A and 23A are for reinforcing the gap parts 12X. As long as the glass fiber bundles 22A and 23A are located above the gap parts 12X, their purposes are fulfilled. The same applies when laminating the insulating layer 21B.

The manufacturing method of the wiring substrate 10 is also applicable to the wiring substrate 30 according to modification 1 of the first embodiment, the wiring substrate 40 according to modification 2 of the first embodiment, the wiring substrate 50 according to modification 3 of the first embodiment, and the wiring substrate 60 according to the second embodiment.

The present invention is not limited to the specific embodiments described herein, and variations and modifications may be made without departing from the scope of the present invention.

For example, in the second embodiment, glass fiber bundles that are narrower than the glass fiber bundles 62A and 62B may be provided in a direction parallel to the X axis, between adjacent glass fiber bundles 62A or adjacent glass fiber bundles 62B.

According to one embodiment of the present invention, a wiring substrate is provided with low manufacturing costs, in which the impact of differences in the glass fiber density on the wirings is minimized.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising: a pair of differential wirings; a first insulating layer that is provided adjacent to one side of the pair of differential wirings, the first insulating layer including first fiber bundles disposed in parallel to an extending direction of the pair of differential wirings; a second insulating layer that is provided adjacent to another side of the pair of differential wirings, the second insulating layer including second fiber bundles disposed in parallel to the extending direction of the pair of differential wirings, the second fiber bundles being disposed by the same pitch as the first fiber bundles; a third insulating layer that is provided on a side of the first insulating layer and opposite to a side of the first insulating layer that is adjacent to the pair of differential wirings, the third insulating layer including third fiber bundles disposed in parallel to the extending direction of the pair of differential wirings; and a fourth insulating layer that is provided on a side of the second insulating layer and opposite to a side of the second insulating layer that is adjacent to the pair of differential wirings, the fourth insulating layer including fourth fiber bundles disposed in parallel to the extending direction of the pair of differential wirings, wherein intervals between the third fiber bundles and intervals between the fourth fiber bundles are respectively narrower than intervals between the first fiber bundles and intervals between the second fiber bundles, and the pair of differential wirings are disposed between adjacent ones of the first fiber bundles at positions that do not overlap the first fiber bundles in a planar view, and are disposed between adjacent ones of the second fiber bundles at positions that do not overlap the second fiber bundles in a planar view.

2. The wiring substrate according to claim 1, wherein wiring widths of the pair of differential wirings are wider than widths of the first fiber bundles and widths of the second fiber bundles.

3. The wiring substrate according to claim 1, wherein widths of the third fiber bundles and widths of fourth fiber bundles are narrower than the wiring widths of the pair of differential wirings.

4. The wiring substrate according to claim 1, wherein the first insulating layer further includes fifth fiber bundles intersecting the first fiber bundles, the second insulating layer further includes sixth fiber bundles intersecting the second fiber bundles, and a pitch of the fifth fiber bundles and a pitch of the sixth fiber bundles are narrower than the pitch of the first fiber bundles and the second fiber bundles.

* * * * *